(12) United States Patent
Kurokawa

(10) Patent No.: US 7,973,410 B2
(45) Date of Patent: Jul. 5, 2011

(54) SEMICONDUCTOR DEVICE

(75) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 612 days.

(21) Appl. No.: 11/527,405

(22) Filed: Sep. 27, 2006

(65) Prior Publication Data

US 2007/0080374 A1  Apr. 12, 2007

(30) Foreign Application Priority Data

Oct. 12, 2005 (JP) ................................ 2005-298244

(51) Int. Cl.
*H01L 21/31* (2006.01)
*H01L 21/469* (2006.01)

(52) U.S. Cl. ........ 257/758; 257/750; 257/760; 438/624; 438/626; 438/637; 438/652; 438/669; 365/192; 365/102; 365/145; 235/435

(58) Field of Classification Search .............. 340/10.51, 340/2.1–2.8, 10.1–10.6, 10.5, 572.1–572.9; 235/435, 375–385, 492; 365/192
See application file for complete search history.

(56) References Cited

U.S. PATENT DOCUMENTS

| | | | |
|---|---|---|---|
| 5,671,254 A * | 9/1997 | Nagata et al. | 375/326 |
| 5,946,561 A * | 8/1999 | Yamazaki et al. | 438/166 |
| 6,321,067 B1 | 11/2001 | Suga et al. | |
| 6,427,067 B1 | 7/2002 | Arentz | |
| 6,478,395 B2 * | 11/2002 | Tanaka et al. | 347/11 |
| 6,504,353 B2 * | 1/2003 | Kobayashi et al. | 323/314 |
| 7,019,617 B2 * | 3/2006 | Pratt et al. | 340/10.1 |
| 7,038,470 B1 * | 5/2006 | Johnson | 324/664 |
| 7,109,845 B2 | 9/2006 | Fischer | |
| 7,262,433 B2 * | 8/2007 | Sugahara et al. | 257/72 |
| 2002/0068388 A1 | 6/2002 | Murakami et al. | |
| 2004/0256996 A1 | 12/2004 | Osame et al. | |
| 2005/0052391 A1 | 3/2005 | Yamazaki et al. | |

(Continued)

FOREIGN PATENT DOCUMENTS

CN  1178407  4/1998

(Continued)

OTHER PUBLICATIONS

Office Action (Application No. 200610064036.1) dated Dec. 4, 2009.

(Continued)

*Primary Examiner* — Zandra Smith
*Assistant Examiner* — Telly D Green
(74) *Attorney, Agent, or Firm* — Eric J. Robinson; Robinson Intellectual Property Law Office, P.C.

(57) ABSTRACT

Since a power source voltage is generated from a communication signal in a wireless chip, there is a risk that a large amount of voltage be generated in the wireless chip to electrically destroy a circuit in the case of supplying a strong communication signal. Therefore, the present invention is made with an aim to provide a wireless chip having resistance to a strong communication signal. A wireless chip of the present invention has an element in which a power source wire and a grounding wire are electrically short-circuited if a power source voltage exceeds a voltage at which an electric circuit is destroyed, i.e., exceeds the specified voltage range. Accordingly, a wireless chip of the present invention has resistance to a strong communication signal.

65 Claims, 14 Drawing Sheets

U.S. PATENT DOCUMENTS

| | | |
|---|---|---|
| 2005/0221542 A1 | 10/2005 | Yamazaki et al. |
| 2006/0121652 A1 | 6/2006 | Murakami et al. |
| 2006/0267690 A1 | 11/2006 | Osada |
| 2007/0028194 A1 | 2/2007 | Kurokawa |
| 2007/0176176 A1 | 8/2007 | Yamazaki et al. |

FOREIGN PATENT DOCUMENTS

| | | |
|---|---|---|
| CN | 1521954 | 8/2004 |
| EP | 0 829 940 | 3/1998 |
| JP | 09-008034 | 1/1997 |
| JP | 2000-149194 | 5/2000 |

OTHER PUBLICATIONS

Chinese Office Action (Application No. 200610064036.1) Dated Nov. 18, 2010.

* cited by examiner

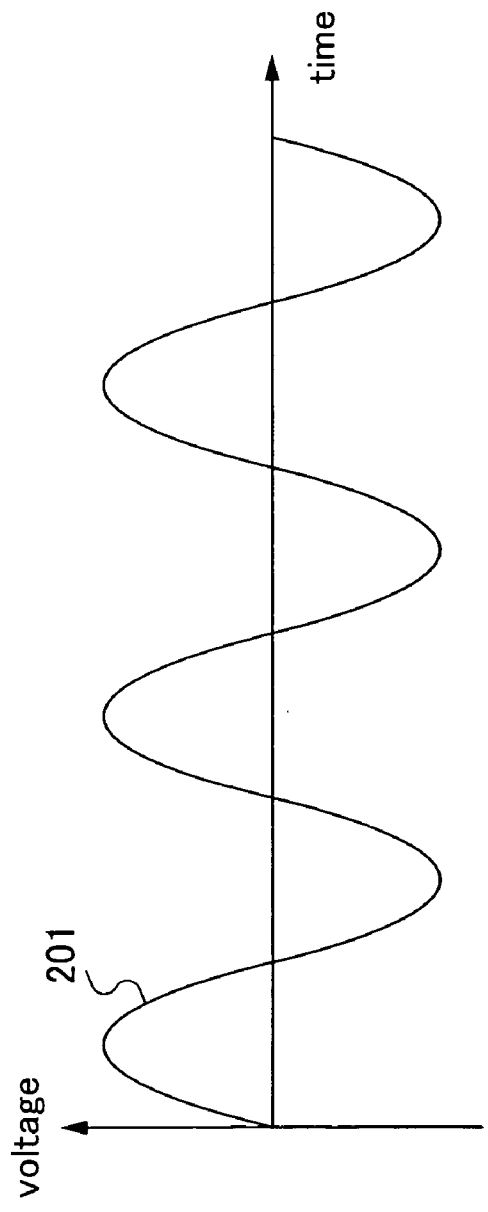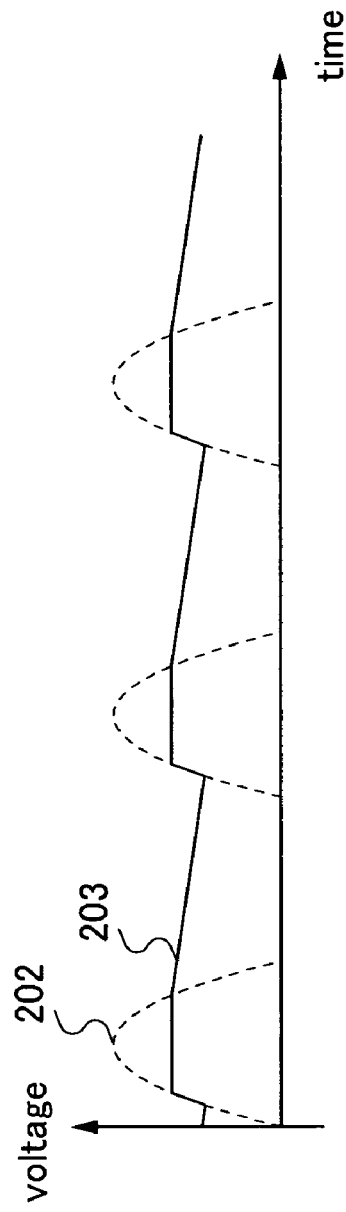

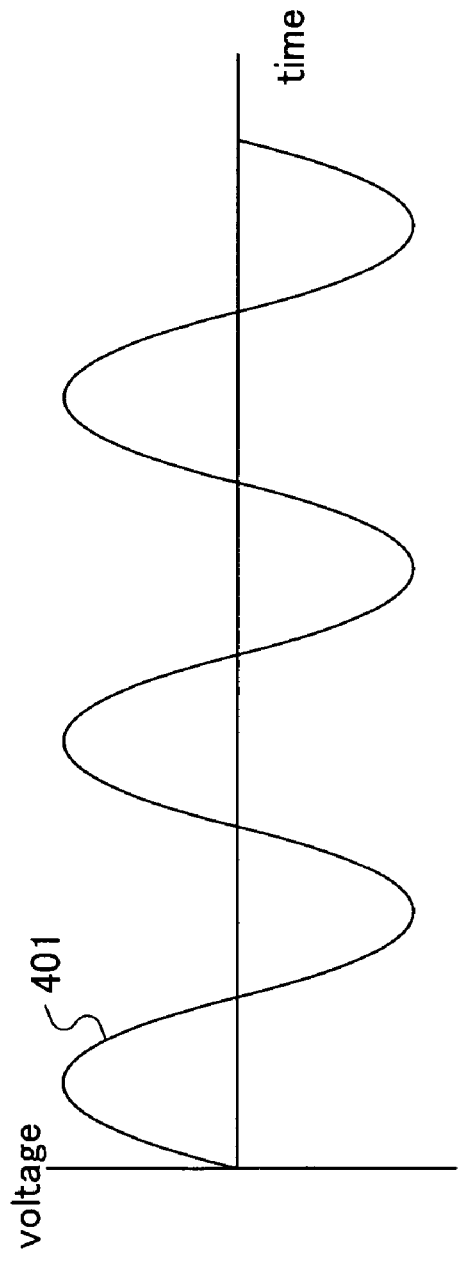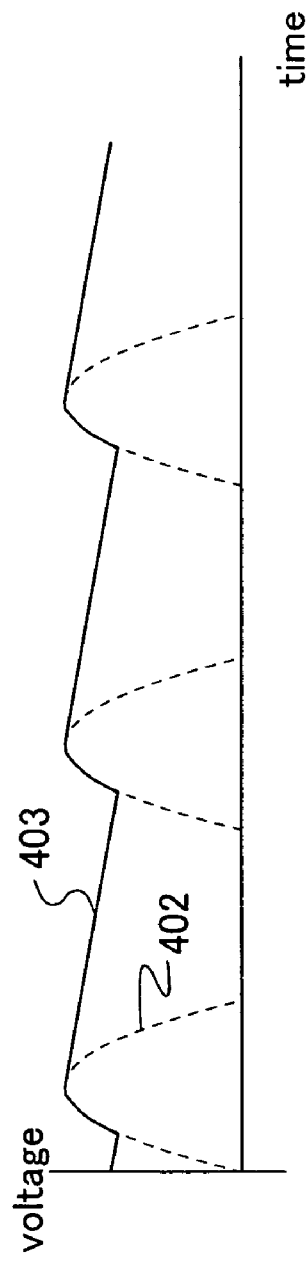

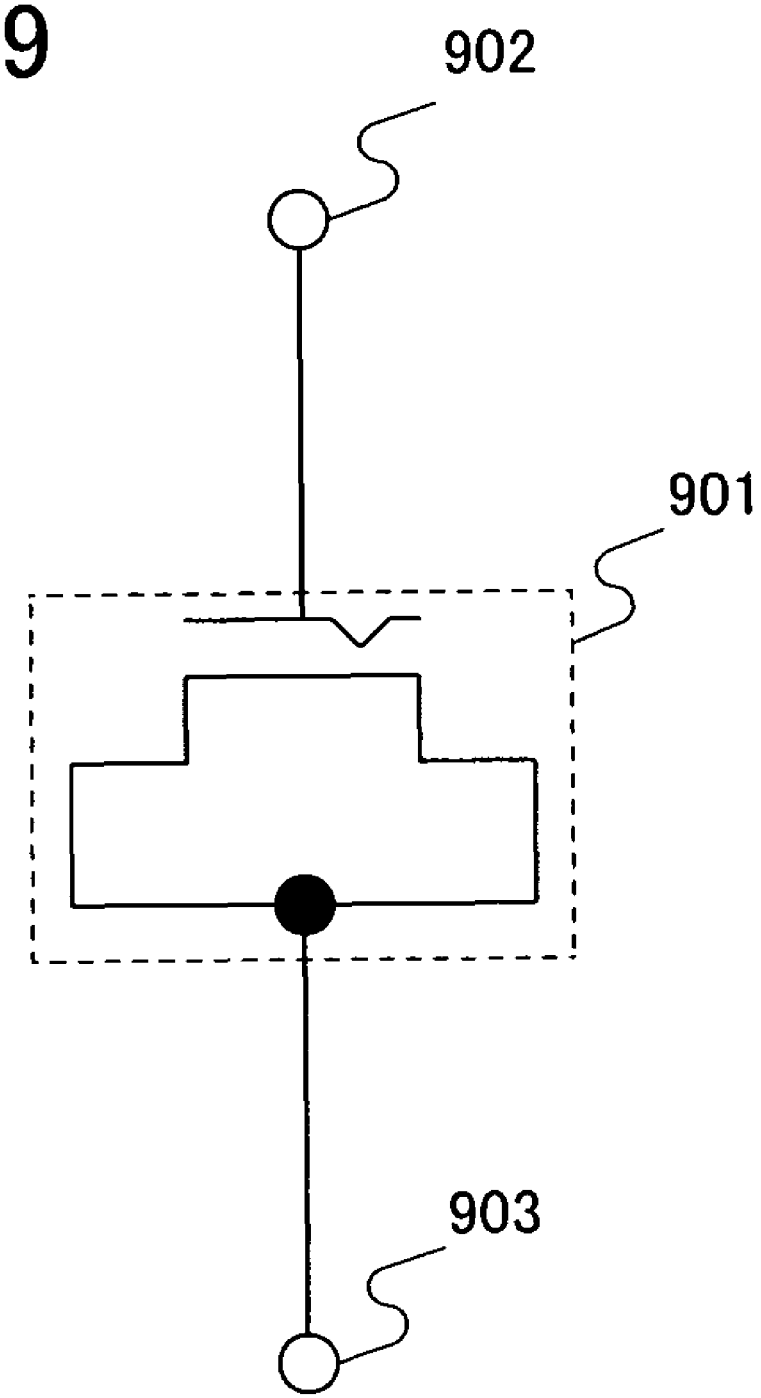

SEMICONDUCTOR DEVICE

BACKGROUND OF THE INVENTION

1. Field of the Invention

The present invention relates to a semiconductor device for wireless communication. The present invention particularly relates to a semiconductor device for supplying a power source voltage which is generated from a communication signal, to a circuit formed by a semiconductor thin film transistor.

2. Description of the Related Art

In recent years, a compact semiconductor device in which a microminiaturized IC chip is combined with an antenna for wireless communication (this semiconductor device is also called a wireless chip hereinafter) is attracting attention. By sending and receiving a communication signal with the use of a wireless communication device (hereinafter referred to as a reader/writer), data can be written in or read from a wireless chip.

As an application field of wireless chips, for example, merchandise management in the distribution industry is known. A merchandise management system using a bar code is the mainstream at present; however, since bar codes are read optically, data cannot be read when there is an interrupting object. On the other hand, when wireless chips are used for merchandise management, data is read wirelessly. Therefore, data can be read even though there is an interrupting object, as long as a wireless communication signal can transmit through the interrupting object. Thus, improvement in efficiency, cost reduction, and the like of merchandise management are expected by using wireless chips for merchandise management. In addition, wide range of applications including boarding passes, airplane tickets, automatic payment of fares, etc. are expected (see Reference 1: Japanese Published Patent Application No.: 2000-149194).

Description is made of a method for generating a power source voltage from a communication signal in a wireless chip, with reference to FIG. 3 and FIGS. 4A and 4B. FIG. 3 shows a power source circuit in a wireless chip, and FIGS. 4A and 4B show change of a voltage over time in each part of the power source circuit.

In FIG. 3, the power source circuit has an antenna portion 301, a rectifying portion 302, and a storage capacitor portion 303. The antenna portion 301 has an antenna 304 and a resonance capacitor 305. By receiving a communication signal, a potential difference is generated between a first output terminal 306 and a second output terminal 307 of the antenna portion 301 (hereinafter this potential difference is called an output potential of the antenna portion 301). The rectifying portion 302 includes a diode 308. For simple description, the rectifying portion 302 is regarded as a half-wave rectifying portion. The first output terminal 306 and the second output terminal 307 of the antenna portion 301 are connected to a first input terminal 309 and a second input terminal 310 of the rectifying portion 302, and a rectified potential difference is generated between a first output terminal 311 and a second output terminal 312 of the rectifying portion 302 (hereinafter this potential difference is called an output potential of the rectifying portion 302). The storage capacitor portion 303 has a storage capacitor 313. The first output terminal 311 and the second output terminal 312 of the rectifying portion 302 are connected to the first input terminal 314 and the second input terminal 315 of the storage capacitor portion 303, and a potential difference is generated between the first output terminal 316 and the second output terminal 317 of the storage capacitor portion 303 (hereinafter this potential difference is called an output potential of the storage capacitor portion 303). The output potential of the storage capacitor portion 303 is a power source voltage of a wireless chip.

Change of the output potential over time in the antenna portion 301 of FIG. 3 is shown by a waveform 401 of FIG. 4A. At this time, change of the output potential over time in the rectifying portion 302 of FIG. 3 is shown by a waveform 402 of FIG. 4B. Moreover, change of the output potential over time in the storage capacitor portion 303 of FIG. 3 is shown by a waveform 403 of FIG. 4B. The diode 308 in the rectifying portion 302 is conductive only if the first input terminal 309 has a higher potential than the first output terminal 311 in the rectifying portion 302. Thus, the diode 308 has a function of rectifying current only in a portion where the output potential of the antenna portion 301 is positive. Although the output potential of the rectifying portion 302 is smoothed by the storage capacitor 313 to be the output potential of the storage capacitor portion 303, the output potential of the storage capacitor portion 303 gradually decreases because it is consumed as electric power by circuits of a wireless chip. Since the aforementioned step is repeated, the output potential of the storage capacitor portion 303 changes over time as the waveform 403.

As set forth above, since a power source voltage is generated from a communication signal in a wireless chip, there is a risk that a large amount of voltage that could electrically destroy a circuit be generated in the wireless chip in the case of supplying a communication signal with strong amplitude. With this risk in mind, a third party may supply a communication signal with strong amplitude on purpose to electrically destroy a circuit so that the information cannot be read from the wireless chip. Destruction of a wireless chip by such a communication signal with strong amplitude is hereinafter called a strong radiowave attack. In order to avoid the situation that information cannot be read from a wireless chip, a wireless chip needs to resist such a strong radiowave attack.

SUMMARY OF THE INVENTION

The present invention has been made in view of the above problems, and therefore is to provide a wireless chip having high resistance to a strong radiowave attack. In particular, the present invention provides a wireless chip including a circuit that sets a power source voltage generated in the wireless chip to be in the range of specified values even if the wireless chip receives a strong communication signal.

A wireless chip of the present invention has, in a power source circuit, a circuit provided with an element in which a power source wire and a grounding wire are electrically short-circuited if a power source voltage exceeds a voltage at which the power source circuit is destroyed, i.e., exceeds a specified voltage range. Since the power source voltage has a predetermined potential difference, the element has a function of electrically short-circuiting the power source wire and the grounding wire if the potential difference of the element exceeds the specified voltage range. By having such a structure, the power source voltage generated in the power source circuit does not exceed the specified voltage range even when a strong communication signal is supplied. Thus, a highly-reliable wireless chip which has high resistance to a strong radiowave attack is provided.

According to a structure of the present invention disclosed in this specification, a power source voltage is generated by a radio signal in a semiconductor device. In this semiconductor device, a power source circuit for generating the power source voltage has a leak element. The electric resistance of the leak element when a voltage exceeding the specified voltage range is generated in the power source circuit becomes lower than that of the leak element when a voltage within the specified voltage range is generated in the power source circuit. Whereby, the leak element retains the power source voltage within the specified voltage range.

According to another structure of the present invention, a power source voltage is generated by a radio signal in a semiconductor device. In this semiconductor device, a power source circuit for generating the power source voltage has a storage capacitor and a leak element. The electric resistance of the leak element when a voltage exceeding the specified voltage range is generated in the power source circuit becomes lower than that of the leak element when a voltage within the specified voltage range is generated in the power source circuit. Then, electric charges accumulated in the storage capacitor flow to the leak element as current. Whereby, the leak element retains the power source voltage within the specified voltage range.

According to another structure of the present invention, a power source voltage is generated by a radio signal in a semiconductor device. In this semiconductor device, a power source circuit for generating the power source voltage includes an antenna portion, a rectifying portion, and a storage capacitor portion. The antenna portion has an antenna and a resonance capacitor, the rectifying portion has a diode, and the storage capacitor portion has a storage capacitor and a leak element. The electric resistance of the leak element when a voltage exceeding the specified voltage range is generated in the power source circuit becomes lower than that of the leak element when a voltage within the specified voltage range is generated in the power source circuit. Then, electric charges accumulated in the storage capacitor flow to the leak element as current. Whereby, the leak element retains the power source voltage within the specified voltage range.

In the present invention, a plurality of diodes can be applied to the rectifying portion.

In the present invention, the power source circuit is formed by a thin film transistor having a semiconductor thin film formed over a substrate having an insulating surface.

In the present invention, any of a glass substrate, a quartz substrate, a plastic substrate, and an SOI substrate can be used as the substrate having an insulating surface.

In the present invention, a potential difference between a first output terminal and a second output terminal of the storage capacitor portion is a power source voltage.

In the present invention, an N-type MOS transistor or a P-type MOS transistor can be applied as the leak element.

In the present invention, an N-type memory transistor or a P-type memory transistor can be applied as the leak element.

In the present invention, an MIS capacitor including a gate insulating film which has a first region and a second region having thinner film thickness than the first region can be applied as the leak element. Alternatively, the leak element may have an MIS capacitor formed by stacking a semiconductor thin film, a gate insulating film, and a gate electrode. The gate insulating film may have a first region and a second region having thinner film thickness than the first region. In this case, the thickness of the gate insulating film in the second region is 50 to 80% of the thickness of the gate insulating film in the first region.

In the present invention, an MIS capacitor formed by stacking a semiconductor thin film, a gate insulating film, and a gate electrode can be applied as the leak element. In this case, the gate insulating film has a first region and a second region having thinner film thickness than the first region, and the second region overlaps with an end portion of the gate electrode.

In the present invention, an MIS capacitor formed by stacking a semiconductor thin film, a gate insulating film, and a gate electrode can be applied as the leak element. In this case, the gate insulating film has a first region and a second region having thinner film thickness than the first region, and the first region overlaps with the semiconductor thin film while the second region overlaps with an end portion of the semiconductor thin film.

In accordance with the present invention, a highly-reliable wireless chip in which a power source voltage is generated by a communication signal can be provided. The present invention is particularly effective in the case of forming the wireless chip by a thin film transistor.

BRIEF DESCRIPTION OF DRAWINGS

In the accompanying drawings:

FIGS. 2A and 2B show signal waveforms of a power source circuit of a semiconductor device of the present invention;

FIGS. 4A and 4B show examples of signal waveforms of a conventional power source circuit;

FIG. 9 shows a circuit of a semiconductor device of the present invention, in which a leak element is formed by an MIS capacitor;

DETAILED DESCRIPTION OF THE INVENTION

Figure 1:
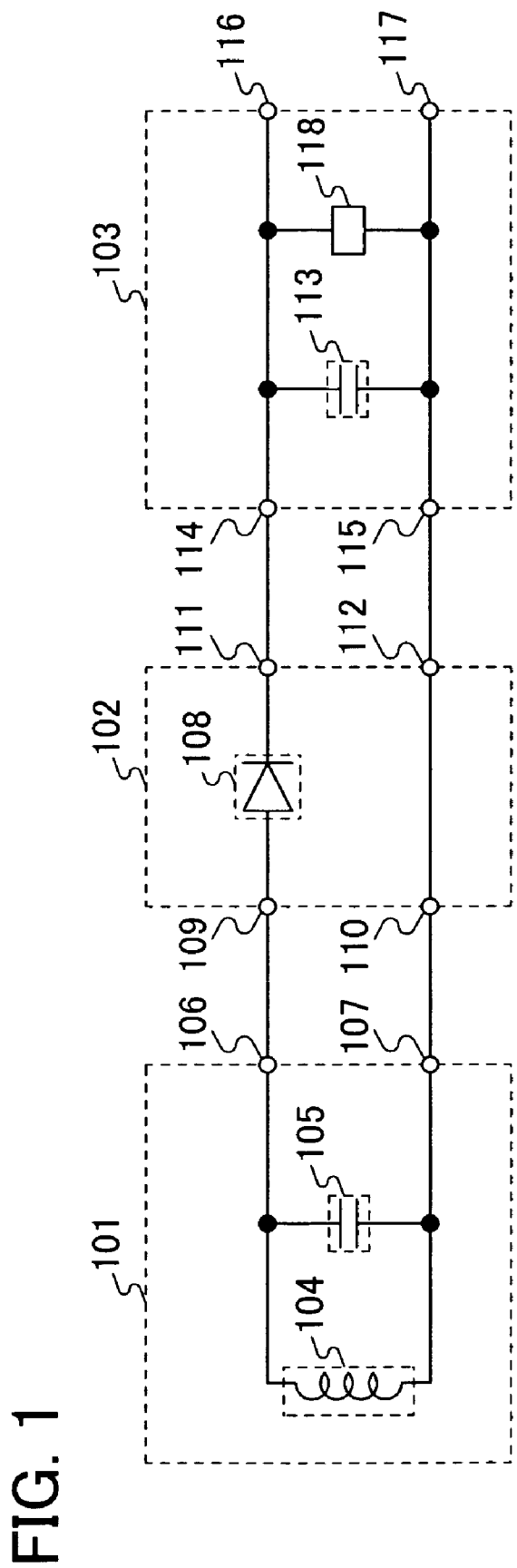
FIG. 1 shows a power source circuit of a semiconductor device in the present invention.
Figure 3:
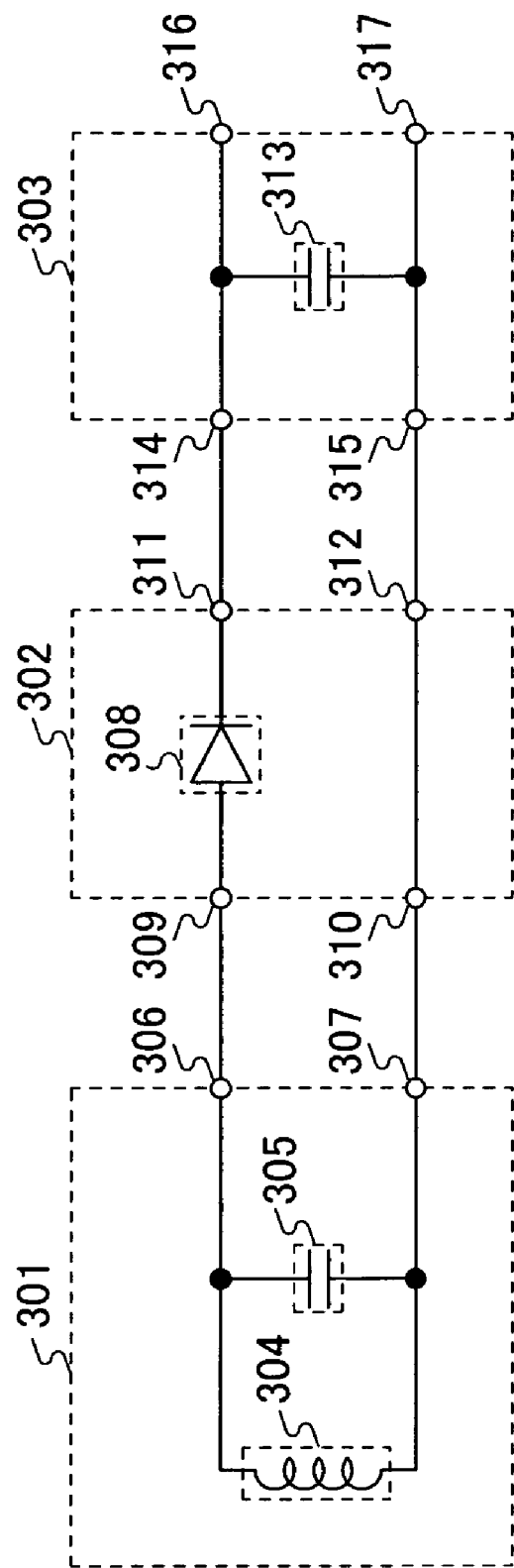
FIG. 3 shows an example of a conventional power source circuit.

Embodiment modes and embodiments of the present invention will be hereinafter described based on drawings. However, since the present invention can be implemented by many different modes, it is easily understood by those skilled in the art that the mode and detail can be variously changed unless departing from the scope and spirit of the present invention. Thus, the present invention will not be construed as being limited to the following description of the embodiment modes and embodiments. The same parts or parts having similar functions are denoted by the same reference numeral and the description of such parts is omitted throughout the drawings for describing the embodiment modes and embodiments.

Embodiment Mode 1

In this embodiment mode, a wireless chip of the present invention is described with reference to FIG. 1 and FIGS. 2A and 2B. FIG. 1 shows a power source circuit in a wireless chip of the present invention and FIGS. 2A and 2B show change of a voltage over time in each part of the power source circuit.

In FIG. 1, the power source circuit has an antenna portion 101, a rectifying portion 102, and a storage capacitor portion 103. The antenna portion 101 has an antenna 104 and a resonance capacitor 105. By receiving a communication signal, a potential difference is generated between a first output terminal 106 and a second output terminal 107 of the antenna portion 101 (hereinafter this potential difference is called an output potential of the antenna portion 101). The present invention can be applied to a communication signal obtained either with or without a wire, and a mode of having an antenna portion to obtain a communication signal without a wire (the signal is referred to as a radio signal) will be described.

The rectifying portion 102 has a diode 108. For simple description, the rectifying portion 102 is regarded as a half-wave rectifying portion. In addition to this, the rectifying portion 102 may be a full-wave rectifying portion. The first output terminal 106 and the second output terminal 107 of the antenna portion 101 are connected to a first input terminal 109 and a second input terminal 110 of the rectifying portion 102. An input terminal of the diode 108 is connected to the first input terminal 109 of the rectifying portion 102, and an output terminal of the diode 108 is connected to a first output terminal 111. The diode 108 is conductive only if the first input terminal 109 has a higher potential than the second input terminal 110. Therefore, a rectified potential difference is generated between the first output terminal 111 and a second output terminal 112 of the rectifying portion 102 (hereinafter this potential difference is called an output potential of the rectifying portion 102). It is to be noted that the output terminal and the input terminal can be collectively referred to as a connection terminal.

The storage capacitor portion 103 has a storage capacitor 113 and a leak element 118. The first output terminal 111 and the second output terminal 112 of the rectifying portion 102 are connected to the first input terminal 114 and the second input terminal 115 of the storage capacitor portion 103, and a potential difference is generated between the first output terminal 116 and the second output terminal 117 of the storage capacitor portion 103 (hereinafter this potential difference is called an output potential of the storage capacitor portion 103). The output potential of the storage capacitor portion 103 is a power source voltage of a wireless chip.

The leak element 118 has electric characteristics that the electric resistance drastically decreases when a voltage exceeding the specified voltage range is generated. The specified voltage range means voltages at which a circuit in the wireless chip typified by a power source circuit is not electrically destroyed; specifically, the range of 1 to 8 V is preferable but the specified voltage range is not limited to this. As the leak element 118, for example, a diode or a transistor having a threshold voltage in the specified voltage range, an MIS capacitor having a large amount of gate leak current when exceeding the specified voltage range, or the like is considered. It is to be noted that the power source circuit does not necessarily have the antenna 104, the resonance capacitor 105, and the diode 108.

In FIG. 2A, change of the output potential over time in the antenna portion 101 of FIG. 1 is shown by a waveform 201. At this time, change of the output potential over time in the rectifying portion 102 of FIG. 1 is shown by a waveform 202 of FIG. 2B. Moreover, change of the output potential over time in the storage capacitor portion 103 of FIG. 1 is shown by a waveform 203 of FIG. 2B. The diode 108 in the rectifying portion 102 is conductive only if the first input terminal 109 has a higher potential than the first output terminal 111 in the rectifying portion 102. Thus, the diode 108 has a function of rectifying current only in a portion where the output potential of the antenna portion 101 is positive.

Here, if the output potential of the rectifying portion 102, i.e., the potential difference between the first input terminal 114 and the second input terminal 115 of the storage capacitor portion 103 is not more than the specified voltage range, the output potential of the rectifying portion 102 is applied to the storage capacitor 113 and the supplied electric charges are accumulated. On the other hand, if the output potential of the rectifying portion 102 exceeds the specified voltage range, the electric resistance of the leak element 118 becomes lower than that in the case where the output potential of the rectifying portion 102 is not more than the specified voltage range. Thus, the electric charges accumulated in the storage capacitor 113 flow to the leak element 118 as current. In other words, the output potential of the storage capacitor portion 103, i.e., the waveform 203 in FIG. 2B does not rise exceeding the specified values.

Although the output potential of the rectifying portion 102 is smoothed by the storage capacitor 113 to be the output potential of the storage capacitor portion 103, the output potential of the storage capacitor portion 103 gradually decreases because it is consumed as electric power by circuits of a wireless chip. Since the aforementioned step is repeated, the output potential of the storage capacitor portion 103 changes over time as the waveform 203 of FIG. 2B.

Even if a communication signal with strong amplitude is supplied to the wireless chip in which the power source voltage is generated by a communication signal, such a structure makes it possible to retain the generated power source voltage within the specified voltage range. Thus, a highly-reliable wireless chip of which circuit will not be electrically destroyed even by a strong radiowave attack is provided.

The wireless chip of this embodiment mode can be formed over a glass substrate, a quartz substrate, a plastic substrate, or an SOI substrate. When thin film transistors which use semiconductor thin films formed over a substrate having an insulating surface, such as a glass substrate, a quartz substrate, or a plastic substrate are used, a highly-reliable and more lightweight wireless chip of high performance that consumes less electric power can be provided at low cost without expanding circuit scale.

Embodiment Mode 2

Figure 5:
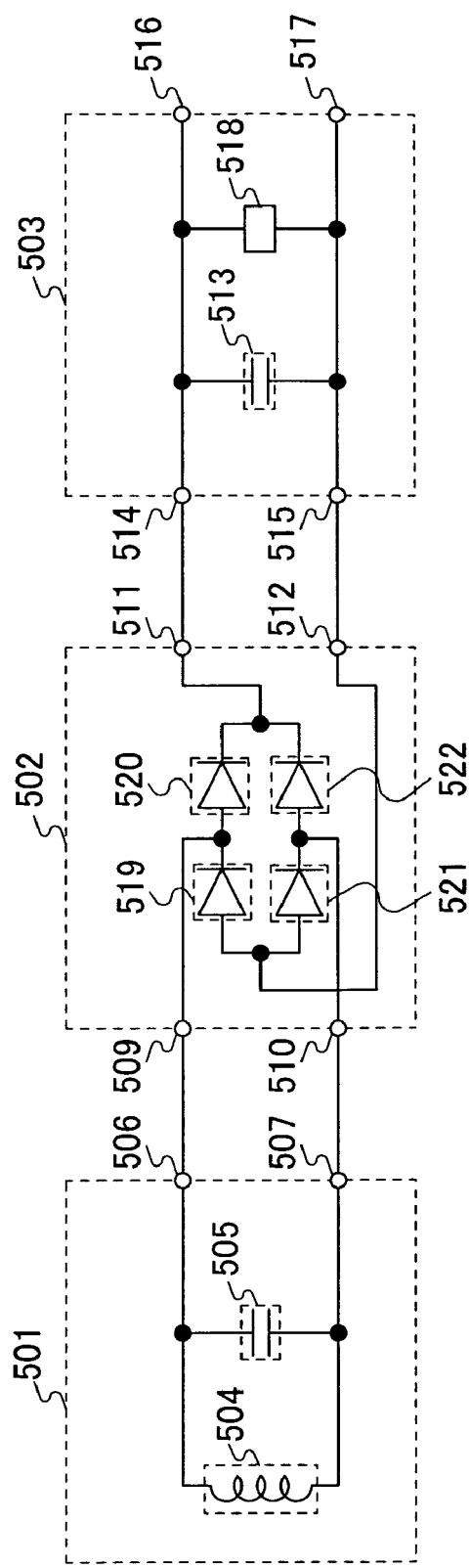
FIG. 5 shows a power source circuit of a semiconductor device of the present invention.
Figure 6A:
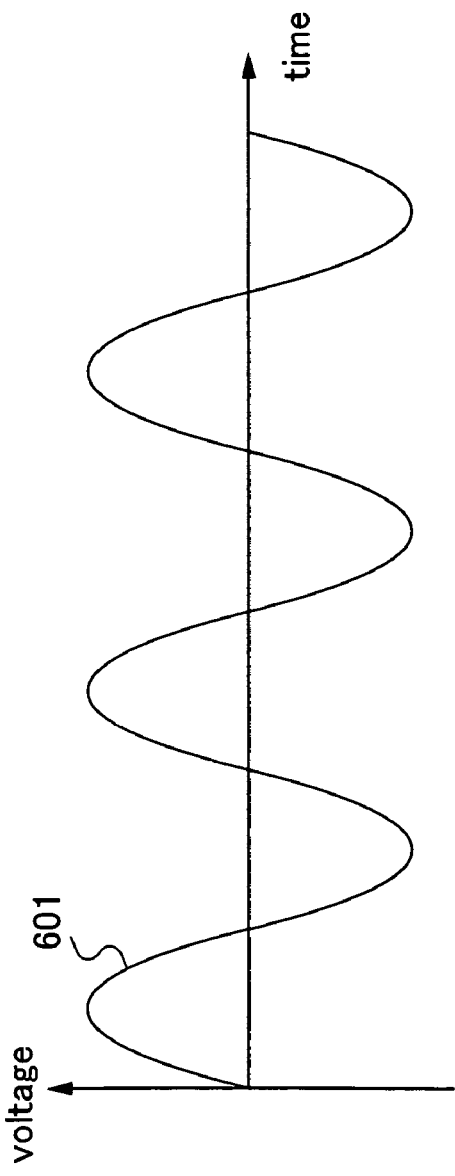
FIGS. 6A and 6B show signal waveforms of a power source circuit of a semiconductor device of the present invention.
Figure 6B:
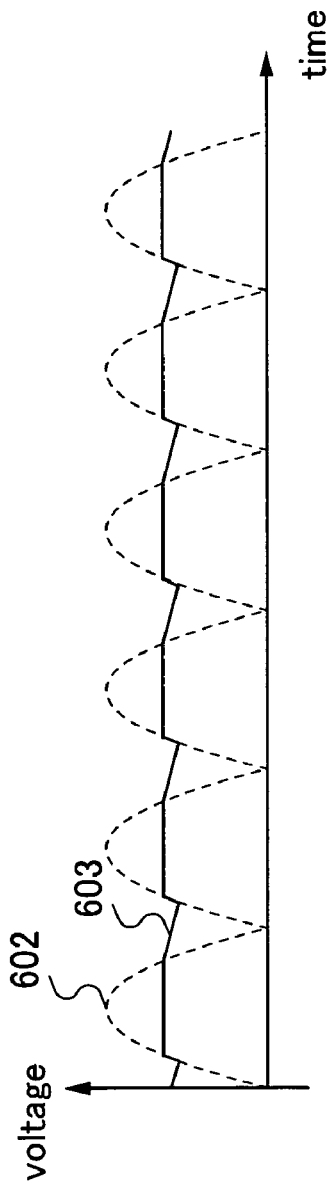

This embodiment mode will describe a wireless chip of the present invention, which has a different mode from that described in Embodiment Mode 1, with reference to FIG. 5 and FIGS. 6A and 6B. FIG. 5 shows a power source circuit in a wireless chip of this embodiment mode. FIGS. 6A and 6B show change of a voltage over time in each part of the power source circuit.

In FIG. 5, the power source circuit has an antenna portion 501, a rectifying portion 502, and a storage capacitor portion 503. The antenna portion 501 and the storage capacitor portion 503 are similar to those in Embodiment Mode 1 except that the rectifying portion 502 has a plurality of diodes: a first diode 519 to a fourth diode 522. The antenna portion 501 has an antenna 504 and a resonance capacitor 505. By receiving a communication signal, a potential difference is generated between a first output terminal 506 and a second output terminal 507 of the antenna portion 501 (hereinafter this potential difference is called an output potential of the antenna portion 501). The present invention can be applied to a communication signal obtained either with or without a wire, and a mode of having an antenna portion to obtain a communication signal without a wire (the signal is referred to as a radio signal) will be described.

In this embodiment mode, the rectifying portion 502 is regarded as a full-wave rectifying portion. The first output terminal 506 and the second output terminal 507 of the antenna portion 501 are connected to a first input terminal 509 and a second input terminal 510 of the rectifying portion 502, and a rectified potential difference is generated between a first output terminal 511 and a second output terminal 512 of the rectifying portion 502 (hereinafter this potential difference is called an output potential of the rectifying portion 502). An input terminal of the first diode 519 is connected to the second output terminal 512 of the rectifying portion 502 while an output terminal of the first diode 519 is connected to the first input terminal 509. An input terminal of the second diode 520 is connected to the first input terminal 509 of the rectifying portion 502 while an output terminal of the second diode 520 is connected to the first output terminal 511. An input terminal of the third diode 521 is connected to the second output terminal 512 of the rectifying portion 502 while an output terminal of the third diode 521 is connected to the second input terminal 510. An input terminal of the fourth diode 522 is connected to the second input terminal 510 of the rectifying portion 502 while an output terminal of the fourth diode 522 is connected to the first output terminal 511.

The storage capacitor portion 503 has a storage capacitor 513 and a leak element 518. The first output terminal 511 and the second output terminal 512 of the rectifying portion 502 are connected to a first input terminal 514 and a second input terminal 515 of the storage capacitor portion 503. Then, a potential difference is generated between a first output terminal 516 and a second output terminal 517 of the storage capacitor portion 503 (hereinafter this potential difference is called an output potential of the storage capacitor portion 503). The output potential of the storage capacitor portion 503 is a power source voltage of a wireless chip.

The leak element 518 has electric characteristics that the electric resistance decreases if the voltage exceeding the specified voltage range is generated. The specified voltage range means voltages at which a circuit in the wireless chip typified by the power source circuit is not electrically destroyed; specifically, the range of 1 to 8 V is preferable but the specified voltage range is not limited to this. As the leak element 518, for example, a diode or a transistor having a threshold voltage in the specified voltage range, an MIS capacitor having a large amount of gate leak current when exceeding the specified voltage range, or the like is considered. It is to be noted that the power source circuit does not necessarily have the antenna 504, the resonance capacitor 505, and the diodes 519 to 522.

In FIG. 6A, change of the output potential over time in the antenna portion 501 of FIG. 5 is shown by a waveform 601. At this time, change of the output potential over time in the rectifying portion 502 of FIG. 5 is shown by a waveform 602 of FIG. 6B. In addition, change of the output potential over time in the storage capacitor portion 503 of FIG. 5 is shown by a waveform 603 of FIG. 6B.

The first diode 519 in the rectifying portion 502 is conductive only if the second output terminal 512 has a higher potential than the first input terminal 509 in the rectifying portion 502. The second diode 520 in the rectifying portion 502 is conductive only if the first input terminal 509 has a higher potential than the first output terminal 511 in the rectifying portion 502. Thus, each of the first diode 519 and the second diode 520 has a function of rectifying current only in a portion where the output potential of the antenna portion 501 is positive. Further, the third diode 521 in the rectifying portion 502 is conductive only if the second output terminal 512 has a higher potential than the second input terminal 510 in the rectifying portion 502. The fourth diode 522 in the rectifying portion 502 is conductive only if the second input terminal 510 has a higher potential than the first output terminal 511 in the rectifying portion 502. Thus, each of the third diode 521 and the fourth diode 522 has a function of rectifying current only in a portion where the output potential of the antenna portion 501 is negative.

When change of the output potential over time in the rectifying portion 102 which is the half-wave rectifying portion in Embodiment Mode 1 (the waveform 202 of FIG. 2B) is compared with that in the rectifying portion 502 in this embodiment mode (the waveform 602 of FIG. 6B), it is understood that the period during which the output potential in the rectifying portion is outputted is doubled. In other words, in the full-wave rectifying portion shown in this embodiment mode, the number of diodes is increased as compared with the half-wave rectifying portion in Embodiment Mode 1; however, the output potential of the antenna portion 501 obtained through a communication signal can be efficiently given to the storage capacitor portion 503.

Here, if the output potential of the rectifying portion 502, i.e., the potential difference between the first input terminal 514 and the second input terminal 515 of the storage capacitor portion 503 is not more than the specified voltage range, the output potential of the rectifying portion 502 is applied to the storage capacitor 513 and the supplied electric charges are accumulated in the storage capacitor 513. On the other hand, if the output potential of the rectifying portion 502 exceeds the specified voltage range, the electric resistance of the leak element 518 becomes lower than that in the case where the output potential of the rectifying portion 502 is not more than the specified voltage range. Thus, the electric charges accumulated in the storage capacitor 513 flow to the leak element 518 as current. That is to say, the output potential of the storage capacitor portion 503, i.e., the waveform 603 in FIG. 6B does not rise exceeding the specified values.

Although the output potential of the rectifying portion 502 is smoothed by the storage capacitor 513 to be the output potential of the storage capacitor portion 503, the output potential of the storage capacitor portion 503 gradually decreases because it is consumed as electric power by circuits of a wireless chip. Since the aforementioned step is repeated, the output potential of the storage capacitor portion 503 changes over time as the waveform 603.

Even if a communication signal with strong amplitude is supplied to the wireless chip in which the power source voltage is generated by a communication signal, such a structure makes it possible to retain the generated power source voltage within the specified voltage range. Thus, a highly-reliable wireless chip of which circuit will not be electrically destroyed even by a strong radiowave attack is provided.

The wireless chip in this embodiment mode can be formed over a glass substrate, a quartz substrate, a plastic substrate, or an SOI substrate. When thin film transistors which includes semiconductor thin films formed over a substrate having an insulating surface, such as a glass substrate, a quartz substrate, or a plastic substrate are used, a highly-reliable and more lightweight wireless chip of high performance that consumes less electric power can be provided at low cost without expanding circuit scale.

Embodiments of the present invention will be described hereinafter with reference to drawings.

Embodiment 1

Figure 7B:
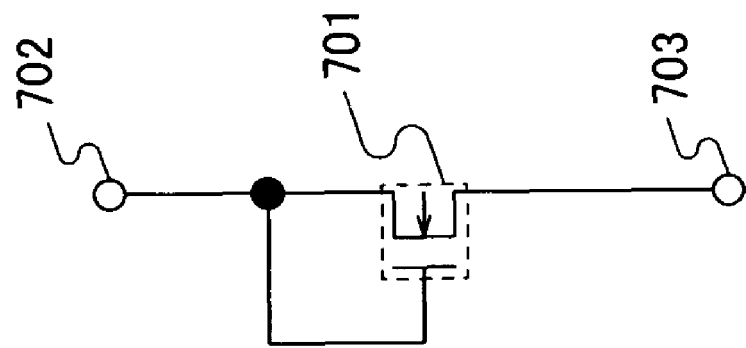
FIGS. 7A and 7B show circuits of semiconductor devices of the present invention, in which leak elements are formed by MOS transistors.
Figure 7A:
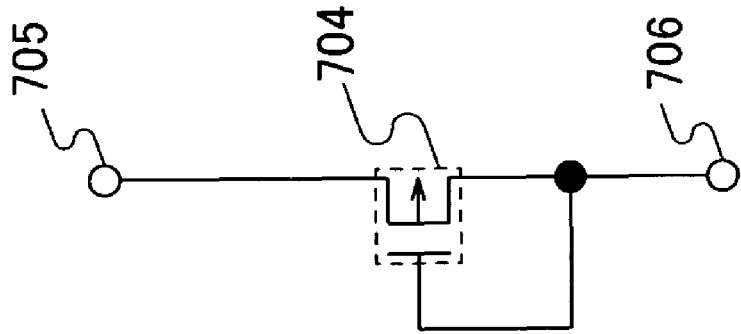

This embodiment will describe an example of using a MOS transistor with reference to FIGS. 7A and 7B, as an example of the leak element in the structure of the wireless chip of the present invention which has been shown in Embodiment Mode 1 and Embodiment Mode 2.

FIG. 7A shows an example in which the leak element is formed using an N-type MOS transistor 701. A first terminal 702 and a second terminal 703 are electrically connected to the first output terminal 116 and the second output terminal 117 of the storage capacitor portion 103 in FIG. 1 shown in Embodiment Mode 1, respectively. Moreover, the first terminal 702 and the second terminal 703 are electrically connected to the first output terminal 516 and the second output terminal 517 of the storage capacitor portion 503 in FIG. 5 shown in Embodiment Mode 2, respectively.

The threshold voltage of the N-type MOS transistor 701 is in the specified voltage range that is determined as voltages at which circuits of the wireless chip are not destroyed electrically. In Embodiment Mode 1, if the potential of the first terminal 702 with respect to the second terminal 703 is not more than the specified voltage range, the output potential of the rectifying portion 102 is applied to the storage capacitor 113 and the supplied electric charges are accumulated. On the other hand, if the output potential of the rectifying portion 102 exceeds the specified voltage range, the electric resistance of the N-type MOS transistor 701 becomes lower than that in the case where the output potential of the rectifying portion 102 is not more than the specified voltage range, and the first terminal 702 and the second terminal 703 are electrically short-circuited. Thus, the electric charges accumulated in the storage capacitor 113 flow to the N-type MOS transistor 701 as current. Similarly, in Embodiment Mode 2, if the potential of the first terminal 702 with respect to the second terminal 703 is not more than the specified voltage range, the output potential of the rectifying portion 502 is applied to the storage capacitor 513 and the supplied electric charges are accumulated. On the other hand, if the output potential of the rectifying portion 502 exceeds the specified voltage range, the electric resistance of the N-type MOS transistor 701 becomes lower than that in the case where the output potential of the rectifying portion 502 is not more than the specified voltage range, and the first terminal 702 and the second terminal 703 are electrically short-circuited. Thus, the electric charges accumulated in the storage capacitor 513 flow to the N-type MOS transistor 701 as current. Therefore, the output potential of the storage capacitor portion 103 described in Embodiment Mode 1 and the output potential of the storage capacitor portion 503 described in Embodiment Mode 2 do not exceed the specified voltage range.

FIG. 7B shows an example of a structure of the leak element formed using a P-type MOS transistor 704. A first terminal 705 and a second terminal 706 are electrically connected to the first output terminal 116 and the second output terminal 117 of the storage capacitor portion 103 in FIG. 1 shown in Embodiment Mode 1, respectively. Alternatively, the first terminal 705 and the second terminal 706 are electrically connected to the first output terminal 516 and the second output terminal 517 of the storage capacitor portion 503 in FIG. 5 shown in Embodiment Mode 2, respectively.

The absolute value of the threshold voltage of the P-type MOS transistor 704 is in the specified voltage range that is determined as voltages at which circuits in the wireless chip are not destroyed electrically. In Embodiment Mode 1, if the potential of the first terminal 705 with respect to the second terminal 706 is not more than the specified voltage range, the output potential of the rectifying portion 102 is applied to the storage capacitor 113 and the supplied electric charges are accumulated. On the other hand, if the output potential of the rectifying portion 102 exceeds the specified voltage range, the electric resistance of the P-type MOS transistor 704 becomes lower than that in the case where the output potential of the rectifying portion 102 is not more than the specified voltage range, and the first terminal 705 and the second terminal 706 are electrically short-circuited. Thus, the electric charges accumulated in the storage capacitor 113 flow to the P-type MOS transistor 704 as current. Similarly, in Embodiment Mode 2, if the potential of the first terminal 705 with respect to the second terminal 706 is not more than the specified voltage range, the output potential of the rectifying portion 502 is applied to the storage capacitor 513 and the supplied electric charges are accumulated. On the other hand, if the output potential of the rectifying portion 502 exceeds the specified voltage range, the electric resistance of the P-type MOS transistor 704 becomes lower than that in the case where the output potential of the rectifying portion 502 is not more than the specified voltage range, and the first terminal 705 and the second terminal 706 are electrically short-circuited. Thus, the electric charges accumulated in the storage capacitor 513 flow to the P-type MOS transistor 704 as current. Thus, the output potential of the storage capacitor portion 103 described in Embodiment Mode 1 and the output potential of the storage capacitor portion 503 described in Embodiment Mode 2 do not exceed the specified voltage range.

Even if a communication signal with strong amplitude is supplied to the wireless chip in which the power source voltage is generated by a communication signal, such a structure makes it possible to retain the generated power source voltage within the specified voltage range. Thus, a highly-reliable wireless chip of which circuit will not be electrically destroyed by a strong radiowave attack is provided.

Embodiment 2

Figure 8B:
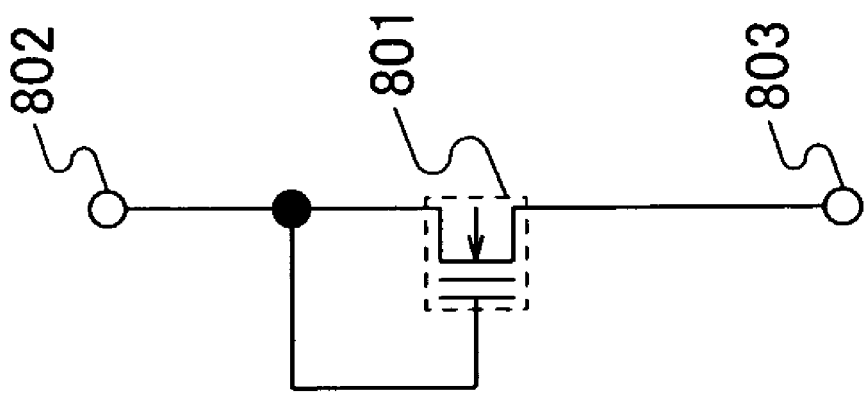
FIGS. 8A and 8B show circuits of semiconductor devices of the present invention, in which leak elements are formed by memory transistors.
Figure 8A:
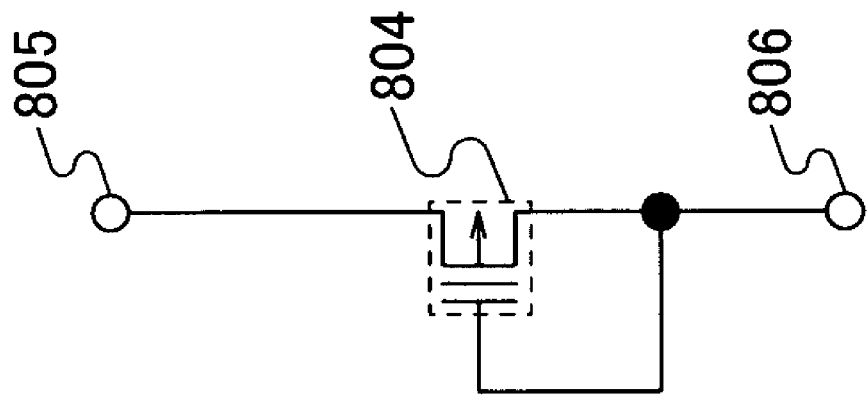

This embodiment will describe an example of using a memory transistor with reference to FIGS. 8A and 8B, as an example of the leak element in the structure of the wireless chip of the present invention which has been shown in Embodiment Mode 1 and Embodiment Mode 2. A memory transistor is an element having a storage function; for example, a transistor having a floating gate or a transistor having a trapping level of electrons in a gate insulating film is given.

FIG. 8A shows an example of a structure of the leak element formed using an N-type memory transistor 801. A first terminal 802 and a second terminal 803 are electrically connected to the first output terminal 116 and the second output terminal 117 of the storage capacitor portion 103 in FIG. 1 shown in Embodiment Mode 1, respectively. Alternatively, the first terminal 802 and the second terminal 803 are electrically connected to the first output terminal 516 and the second output terminal 517 of the storage capacitor portion 503 in FIG. 5 shown in Embodiment Mode 2, respectively.

The N-type memory transistor 801 can be a nonvolatile memory in which a floating gate is added in a gate insulating film of an N-type MOS transistor. In this case, the threshold voltage of the N-type memory transistor 801 can be determined by changing the amount of electric charges retained by the floating gate. Moreover, the N-type memory transistor 801 can be a nonvolatile memory in which a nitride film that forms a trapping level for electric charges is added in a gate insulating film of an N-type MOS transistor. In this case, the threshold voltage of the N-type memory transistor 801 can be determined by changing the amount of electric charges retained in the nitride film.

The threshold voltage of the N-type memory transistor 801 is in the specified voltage range that is determined as voltages at which circuits of the wireless chip of the present invention are not destroyed electrically. In Embodiment Mode 1, if the potential of the first terminal 802 with respect to the second terminal 803 is not more than the specified voltage range, the output potential of the rectifying portion 102 is applied to the storage capacitor 113 and the supplied electric charges are accumulated. On the other hand, if the output potential of the rectifying portion 102 exceeds the specified voltage range, the electric resistance of the N-type memory transistor 801 becomes lower than that in the case where the output potential of the rectifying portion 102 is not more than the specified voltage range, and the first terminal 802 and the second terminal 803 are electrically short-circuited. Thus, the electric charges accumulated in the storage capacitor 113 flow to the N-type memory transistor 801 as current. Similarly, in Embodiment Mode 2, if the potential of the first terminal 802 with respect to the second terminal 803 is not more than the specified voltage range, the output potential of the rectifying portion 502 is applied to the storage capacitor 513 and the supplied electric charges are accumulated. On the other hand, if the output potential of the rectifying portion 502 exceeds the specified voltage range, the electric resistance of the N-type memory transistor 801 becomes lower than that in the case where the output potential of the rectifying portion 502 is not more than the specified voltage range, and the first terminal 802 and the second terminal 803 are electrically short-circuited. Thus, the electric charges accumulated in the storage capacitor 113 flow to the N-type memory transistor 801 as current. Accordingly, the output potential of the storage capacitor portion 103 described in Embodiment Mode 1 and the output potential of the storage capacitor portion 503 described in Embodiment Mode 2 do not exceed the specified voltage range.

FIG. 8B shows an example of a structure of the leak element formed using a P-type memory transistor 804. A first terminal 805 and a second terminal 806 are electrically connected to the first output terminal 116 and the second output terminal 117 of the storage capacitor portion 103 in FIG. 1 shown in Embodiment Mode 1, respectively. Alternatively, the first terminal 805 and the second terminal 806 are electrically connected to the first output terminal 516 and the second output terminal 517 of the storage capacitor portion 503 in FIG. 5 shown in Embodiment Mode 2, respectively.

The P-type memory transistor 804 can be a nonvolatile memory in which a floating gate is added in a gate insulating film of a P-type MOS transistor. In this case, the threshold voltage of the P-type memory transistor 804 can be determined by changing the amount of electric charges retained by the floating gate. Moreover, the P-type memory transistor 804 can be a nonvolatile memory in which a nitride film that forms a trapping level for electric charges is added in a gate insulating film of a P-type MOS transistor. In this case, the threshold voltage of the P-type memory transistor 804 can be determined by changing the amount of electric charges retained in the nitride film.

The absolute value of the threshold voltage of the P-type memory transistor 804 is in the specified voltage range that is determined as voltages at which circuits of the wireless chip of the present invention are not destroyed electrically. In Embodiment Mode 1, if the potential of the first terminal 805 with respect to the second terminal 806 is not more than the specified voltage range, the output potential of the rectifying portion 102 is applied to the storage capacitor 113 and the supplied electric charges are accumulated. On the other hand, if the output potential of the rectifying portion 102 exceeds the specified voltage range, the electric resistance of the P-type memory transistor 804 becomes lower than that in the case where the output potential of the rectifying portion 102 is not more than the specified voltage range, and the first terminal 805 and the second terminal 806 are electrically short-circuited. Thus, the electric charges accumulated in the storage capacitor 113 flow to the P-type memory transistor 804 as current. Similarly, in Embodiment Mode 2, if the potential of the first terminal 802 with respect to the second terminal 803 is not more than the specified voltage range, the output potential of the rectifying portion 502 is applied to the storage capacitor 513 and the supplied electric charges are accumulated in the storage capacitor 513. On the other hand, if the output potential of the rectifying portion 502 exceeds the specified voltage range, the electric resistance of the P-type memory transistor 804 becomes lower than that in the case where the output potential of the rectifying portion 502 is not more than the specified voltage range, and the first terminal 805 and the second terminal 806 are electrically short-circuited. Thus, the electric charges accumulated in the storage capacitor 113 flow to the P-type memory transistor 804 as current. Accordingly, the output potential of the storage capacitor portion 103 described in Embodiment Mode 1 and the output potential of the storage capacitor portion 503 described in Embodiment Mode 2 do not exceed the specified voltage range.

Even if a communication signal with strong amplitude is supplied to the wireless chip in which the power source voltage is generated by a communication signal, such a structure makes it possible to retain the generated power source voltage within the specified voltage range. Thus, a highly-reliable wireless chip of which circuit will not be electrically destroyed by a strong radiowave attack is provided.

Embodiment 3

This embodiment will describe an example of using an MIS capacitor with reference FIG. 9 and FIGS. 10A to 10C, as an example of the leak element in the structure of the wireless chip of the present invention which has been shown in Embodiment Mode 1 and Embodiment Mode 2.

FIG. 9 shows an example of a structure of the leak element formed using an MIS capacitor 901. A first terminal 902 and a second terminal 903 are electrically connected to the first output terminal 116 and the second output terminal 117 of the storage capacitor portion 103 in FIG. 1 shown in Embodiment Mode 1, respectively. Alternatively, the first terminal 902 and the second terminal 903 are electrically connected to the first output terminal 516 and the second output terminal 517 of the storage capacitor portion 503 in FIG. 5 shown in Embodiment Mode 2, respectively.

The MIS capacitor 901 has characteristics that its gate leak current increases drastically if a voltage is generated in excess of the specified voltage range that is determined as voltages at which circuits in the wireless chip of the present invention are not destroyed electrically. Thus, when the potential of the first terminal 902 with respect to the second terminal 903 exceeds the specified voltage range, the electric resistance of the MIS capacitor 901 becomes lower than that in the case where the output potential of the rectifying portion 502 is not more than the specified voltage range, and the first terminal 902 and the second terminal 903 are short-circuited electrically. Therefore, the output potential of the storage capacitor portion 103 described in Embodiment Mode 1 and the output potential of the storage capacitor portion 503 described in Embodiment Mode 2 do not exceed the specified voltage range.

Figures 10A, 10B, 10C:
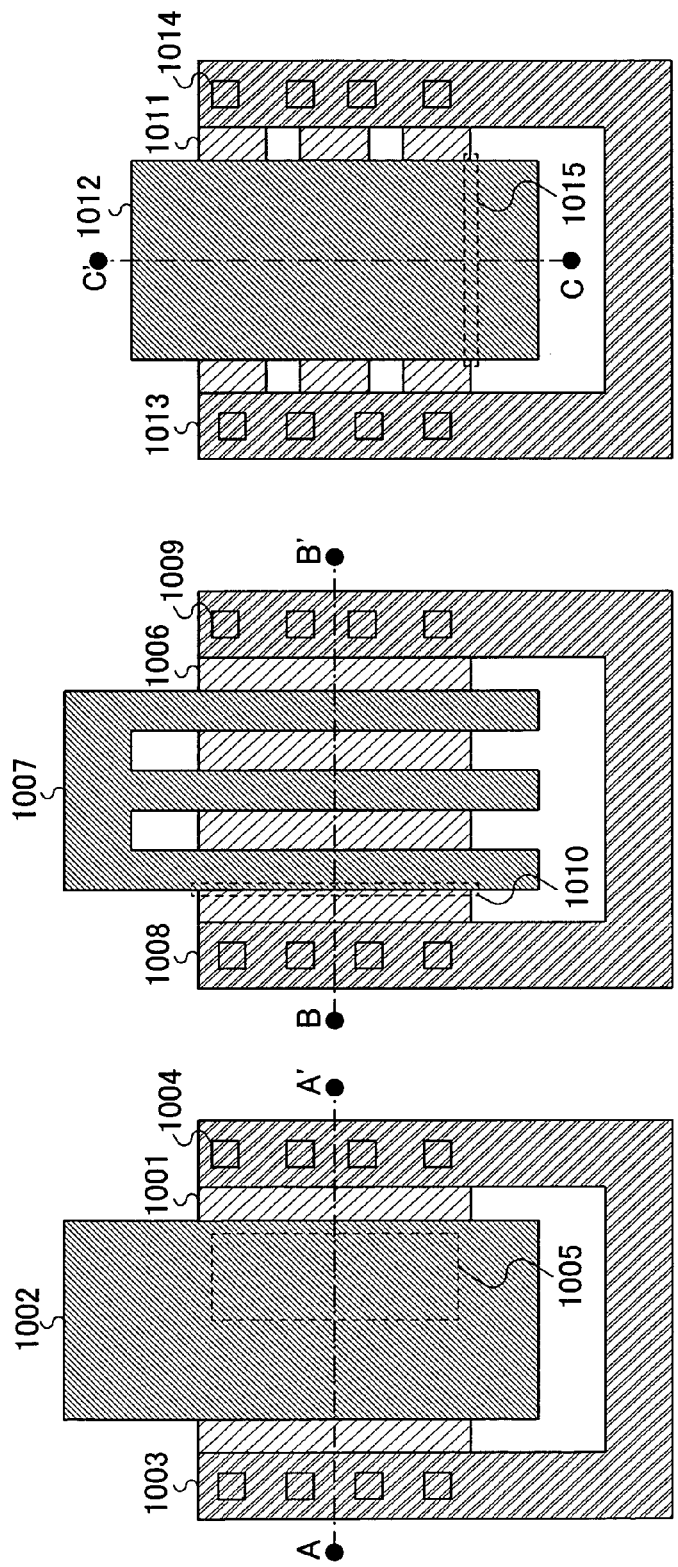
FIGS. 10A to 10C show layouts of leak elements of semiconductor devices of the present invention.

FIGS. 10A and 10B show the layout and the cross section of the MIS capacitor 901 having the aforementioned characteristics. In FIG. 10A, a gate insulating film 1016 is stacked over a semiconductor thin film 1001 and a gate electrode 1002 is formed over the gate insulating film 1016. Moreover, an interlayer insulating film is stacked over the gate electrode 1002, and source and drain electrodes 1003 are formed over the interlayer insulating film. The source and drain electrodes 1003 are electrically connected to the semiconductor thin film 1001 through a contact 1004. It is to be noted that the gate electrode 1002 and the source and drain electrodes 1003 correspond to the first terminal 902 and the second terminal 903 in FIG. 9, respectively.

The gate insulating film 1016 of the MIS capacitor 901 has a first region and a second region. The gate insulating film 1016 is thinner in the second region than in the first region. A leak path 1005 corresponds to the second region of the gate insulating film. In other words, the electric withstanding voltage of the gate insulating film is low in the second region. The leak path 1005 may be formed by, for example, forming the gate insulating film 1016 and then etching the gate insulating film 1016 by an etching step using a photomask. Here, the film thickness of the gate insulating film is determined so that if a voltage exceeding the specified voltage range is generated in the MIS capacitor, a large amount of gate leak current flows through the leak path 1005. For example, the gate insulating film can be formed with a thickness of 3 to 10 nm on the surface of silicon by a thermal oxidation method. Then, in order to flow the gate leak current, the film thickness of the gate insulating film in the second region may be determined in the range of 50 to 80% of the film thickness of the gate insulating film in the first region. For example, if the gate insulating film has a thickness of 30 nm in the first region, the gate insulating film has a thickness of 15 to 24 nm in the second region.

Therefore, the output potential of the storage capacitor portion 103 described in Embodiment Mode 1 and the output potential of the storage capacitor portion 503 described in Embodiment Mode 2 do not exceed the specified voltage range.

In FIG. 10B, a gate insulating film 1017 is stacked over a semiconductor thin film 1006 and a gate electrode 1007 is formed over the gate insulating film 1017. Moreover, an interlayer insulating film is stacked over the gate electrode 1007 and source and drain electrodes 1008 are formed over the interlayer insulating film. The source and drain electrodes 1008 are electrically connected to the semiconductor thin film 1006 through a contact 1009. It is to be noted that the gate electrode 1007 and the source and drain electrodes 1008 correspond to the first terminal 902 and the second terminal 903 in FIG. 9, respectively.

The gate insulating film 1017 of the MIS capacitor 901 has a first region and a second region having thinner film thickness than the first region, and a leak path 1010 corresponds to the second region of the gate insulating film 1017. If etching is anisotropic at the formation of the gate, a part of the gate insulating film 1017 under the gate electrode 1007 is gouged to cause a defect 1019, and a region where the defect is caused is the leak path 1010, which corresponds to the region where the gate insulating film 1017 is thin. In other words, in the second region, the gate insulating film has low electric withstanding voltage. If a voltage exceeding the specified voltage range is generated in the MIS capacitor, a large amount of gate leak current flows through the leak path 1010. In FIG. 10B, a plurality of second regions are formed in the gate insulating film 1017 so as to overlap with end portions of the gate electrode 1007. By applying the MIS capacitor having such a leak path, the output potential of the storage capacitor portion 103 described in Embodiment Mode 1 and the output potential of the storage capacitor portion 503 described in Embodiment Mode 2 do not exceed the specified voltage range.

Moreover, in FIG. 10C, a gate insulating film 1018 is stacked over a semiconductor thin film 1011 and a gate electrode 1012 is formed over the gate insulating film 1018. In addition, an interlayer insulating film is stacked over the gate electrode 1012, and source and drain electrodes 1013 are formed over the interlayer insulating film. The source and drain electrodes 1013 are electrically connected to the semiconductor thin film 1011 through a contact 1014. It is to be noted that the gate electrode 1012 and the source and drain electrodes 1013 correspond to the first terminal 902 and the second terminal 903 in FIG. 9, respectively.

The gate insulating film 1018 of the MIS capacitor 901 has a first region overlapping with the semiconductor thin film 1011 and a second region in which the film thickness of the gate insulating film is thinner than that in the first region, and a leak path 1015 corresponds to the second region of the gate insulating film. The leak path 1015 is a region in the gate insulating film where a lattice defect 1020 is caused by mechanical stress in the step of forming the gate insulating film and where the gate insulating film 1018 is thin. In such a thin region, the gate insulating film has a low electric withstanding voltage. If a voltage exceeding the specified voltage range is generated in the MIS capacitor, a large amount of gate leak current flows through the leak path 1015. In FIG. 10C, a plurality of second regions are formed in the gate insulating film 1018 so as to overlap with end portions of the semiconductor thin film 1011. By applying the MIS capacitor having such a leak path, the output potential of the storage capacitor portion 103 described in Embodiment Mode 1 and the output potential of the storage capacitor portion 503 described in Embodiment Mode 2 do not exceed the specified voltage range.

Even if a communication signal with strong amplitude is supplied to the wireless chip in which the power source voltage is generated by a communication signal, such a structure makes it possible to retain the generated power source voltage within the specified voltage range. Thus, a highly-reliable wireless chip of which circuit will not be electrically destroyed by a strong radiowave attack is provided.

Although this embodiment has described using the MIS capacitor, a capacitor including a thin film transistor (referred to as a TFT capacitor) can be used. In the case of using a TFT capacitor, the gate insulating film can have a thickness of 20 to 100 nm. Moreover, in FIG. 10A, the film thickness of the second region may be 50 to 80% of the film thickness of the first region. For example, if the gate insulating film has a thickness of 20 nm in the first region, the gate insulating film has a thickness of 10 to 16 nm in the second region.

Embodiment 4

Figure 13:
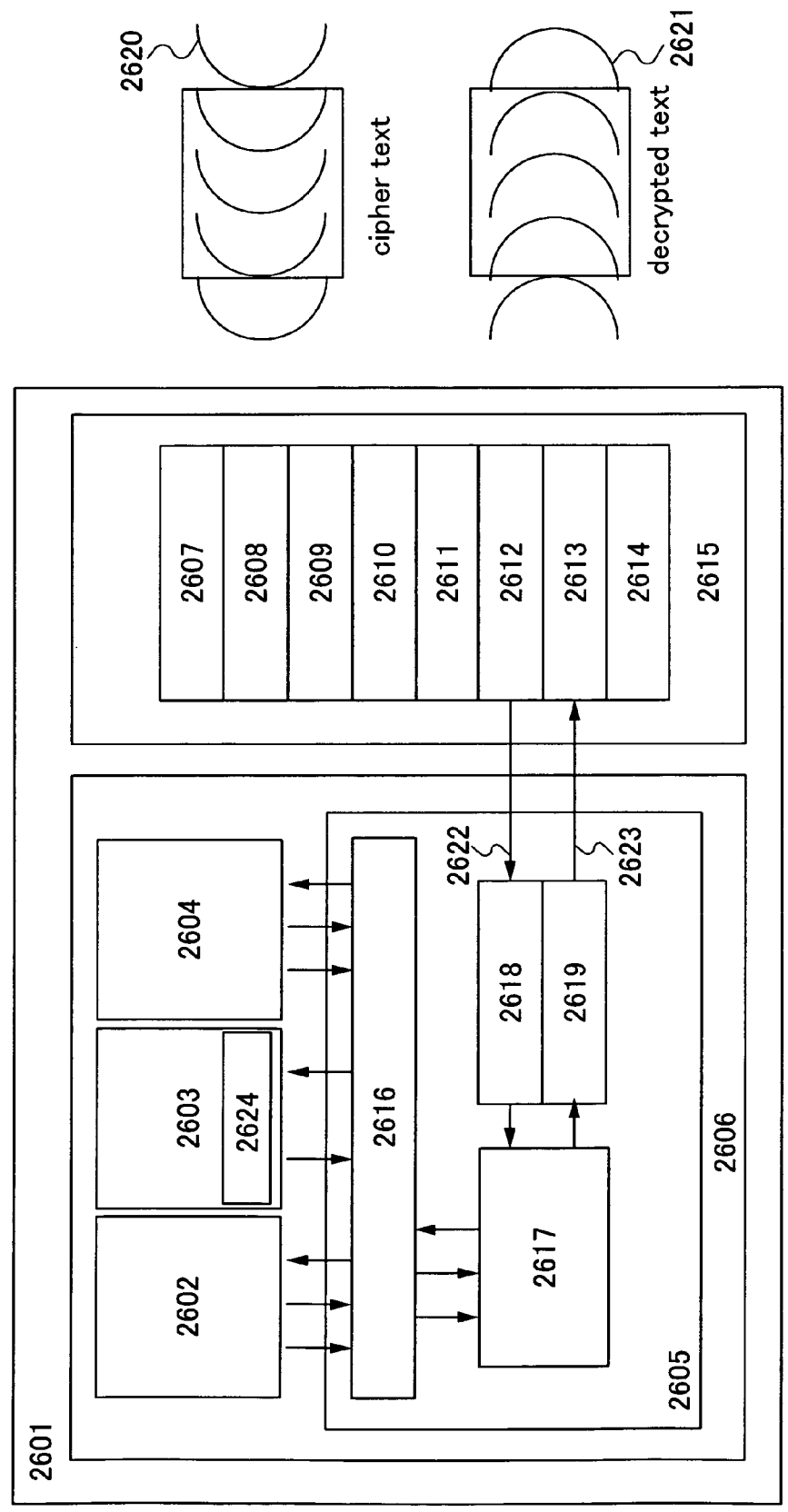
FIG. 13 shows a structural example of a semiconductor device of the present invention.
Figure 14:
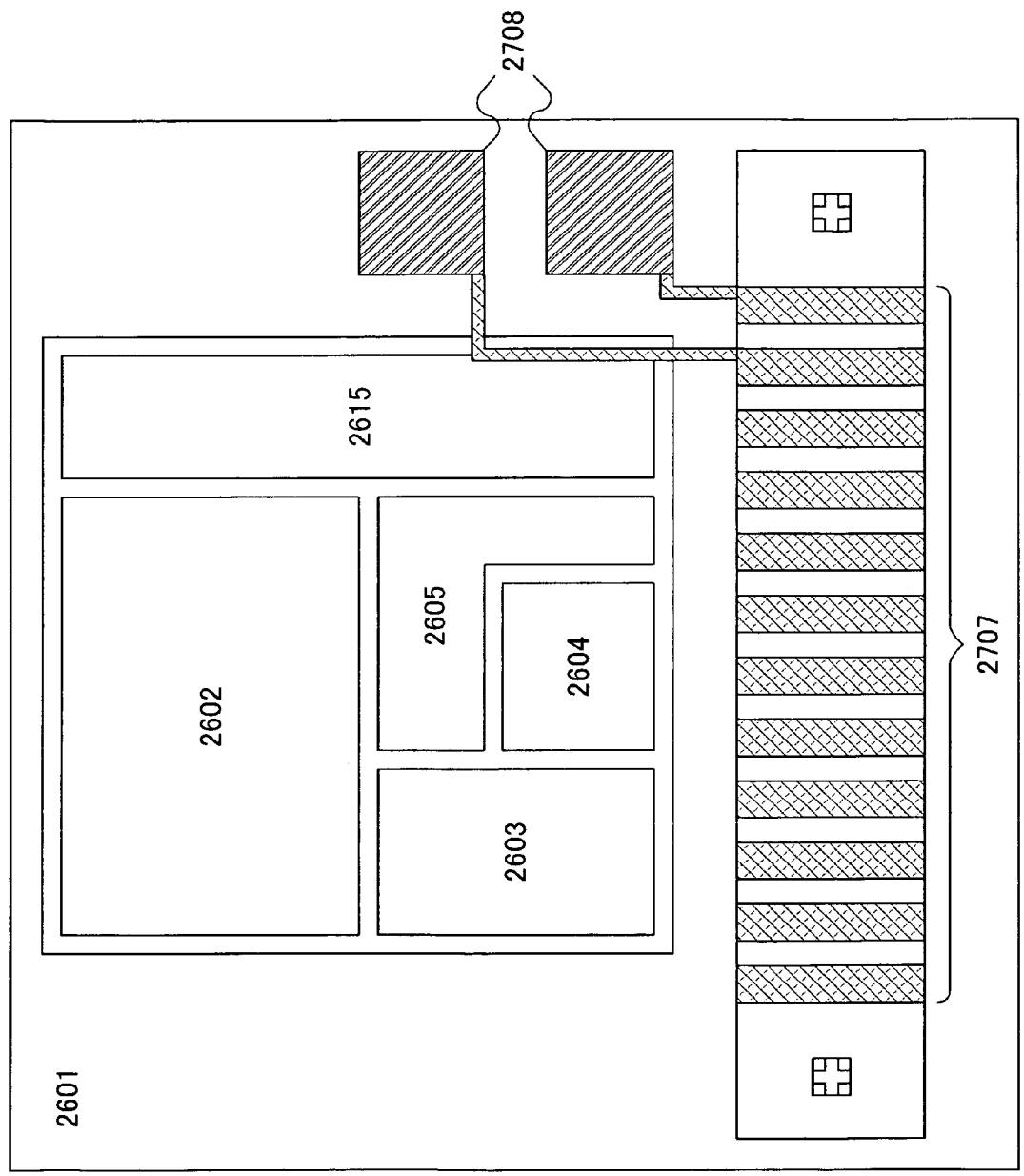
FIG. 14 shows an example of a layout of a semiconductor device of the present invention.

This embodiment will describe a wireless chip having a cipher processing function with reference to FIGS. 13 and 14, as an example of a semiconductor device of the present invention. FIG. 13 is a block diagram of the wireless chip and FIG. 14 shows a layout of the wireless chip.

First, a block structure of the wireless chip is described with reference to FIG. 13. In FIG. 13, a wireless chip 2601 includes an arithmetic circuit 2606 and an analog portion 2615. The arithmetic circuit 2606 has a CPU 2602, a ROM 2603, a RAM 2604, and a controller 2605. The analog portion 2615 has an antenna portion 2607 having an antenna, a resonance circuit 2608 having a resonance capacitor, a power source circuit 2609, a reset circuit 2610, a clock generating circuit 2611, a demodulating circuit 2612, a modulating circuit 2613, and a power source controlling circuit 2614. The aforementioned circuit structure can be applied to the power source circuit 2609.

The controller 2605 has a CPU interface (CPUIF) 2616, a control register 2617, a code extracting circuit 2618, and a encoding circuit 2619. Although communication signals are shown separately as a receiving signal 2620 and a sending signal 2621 in FIG. 13 for simplifying the description, actually, both overlap with each other and the signals are sent and received at the same time between the wireless chip 2601 and a reader/writer. After the receiving signal 2620 is received by the antenna portion 2607 and the resonance circuit 2608, the receiving signal 2620 is demodulated by the demodulating circuit 2612. The sending signal 2621 is modulated by the modulating circuit 2613, and then sent from the antenna portion 2607.

In FIG. 13, when the wireless chip 2601 is set in a magnetic field formed by the communication signal, induced electromotive force is generated by the antenna portion 2607 and the resonance circuit 2608. The induced electromotive force is retained by an electric capacitor in the power source circuit 2609, and the potential is stabilized by the electric capacitor and supplied to each circuit in the wireless chip 2601 as a power source voltage. It is to be noted that the antenna portion 2607, resonance circuit 2608, and the power source circuit 2609 can also be referred to as a circuit for supplying the power source voltage in the present invention. The reset circuit 2610 generates an initial reset signal of the whole wireless chip 2601. For example, a signal that rises after the increase in the power source voltage is generated as the reset signal. The clock generating circuit 2611 changes frequency and duty ratio of a clock signal in accordance with a control signal generated by the power source controlling circuit 2614. The demodulating circuit 2612 detects the change of the amplitude of the receiving signal 2620 in an ASK method as receiving data 2622 of "0"/"1". The demodulating circuit 2612 corresponds to, for example, a low-pass filter. Moreover, the modulating circuit 2613 sends sending data after changing the amplitude of the sending signal 2621 in an ASK method. For example, if sending data 2623 is "0", the point of resonance of the resonance circuit 2608 is changed to change the amplitude of the communication signal. The power source controlling circuit 2614 monitors a power source voltage supplied to the arithmetic circuit 2606 from the power source circuit 2609 and consumption current in the arithmetic circuit 2606. The clock generating signal 2611 generates a control signal for changing the frequency and the duty ratio of the clock signal.

An operation of the wireless chip in this embodiment is described. First, the wireless chip 2601 receives the receiving signal 2620 including cipher text data from the reader/writer. The receiving signal 2620 is demodulated by the demodulating circuit 2612 and then divided by the code extracting circuit 2618 into a control command, cipher text data, or the like, which is subsequently stored in the control register 2617. Here, the control command is data specifying response of the wireless chip 2601. For example, transmission of unique ID numbers, operation stop, cipher breaking, and the like are specified. Here, a control command of cipher breaking is to be received.

Subsequently, in the arithmetic circuit 2606, the CPU 2602 breaks (decrypts) the cipher text by using a secret key 2624 stored in advance in the ROM 2603 in accordance with a code breaking program stored in the ROM 2603. The decrypted cipher text (decrypted text) is stored in the control register 2617. At this time, the RAM 2604 is used as a data storage region. The CPU 2602 accesses the ROM 2603, the RAM 2604, and the control register 2617 through the CPU interface (CPUIF) 2616. The CPU interface (CPUIF) 2616 has a function of generating an access signal for any of the ROM 2603, the RAM 2604, and the control register 2617 based on an address required by the CPU 2602. It is to be noted that the CPU 2602, the ROM 2603, the RAM 2604, the demodulating circuit 2612, and the modulating circuit 2613 are operationally connected to the controller 2605.

At last, the encoding circuit 2619 generates the sending data 2623 from the decrypted text, which is then modulated in the modulating circuit 2613. Next, the sending signal 2621 is sent to the reader/writer from the antenna portion 2607.

Although this embodiment has described, as the arithmetic method, a processing method using software, i.e., a method in which the arithmetic circuit is formed by the CPU and the large-scale memory and a program is executed by the CPU, it is also possible to select the optimum arithmetic method in accordance with the purpose and to form the arithmetic circuit based on the selected method. For example, as the arithmetic method, there are another method of processing arithmetic using hardware and another method in which hardware and software are combined. In the method using hardware, the arithmetic circuit may be formed by a dedicated circuit. In the method in which hardware and software are combined, the arithmetic circuit may be formed by a dedicated circuit, a CPU, and a memory and a part of the arithmetic processing may be carried out by the dedicated circuit and the rest of the arithmetic processing program may be executed by the CPU.

Subsequently, a layout structure of the wireless chip will be described with reference to FIG. 14. In FIG. 14, the same parts as those in FIG. 13 are denoted by the same reference numerals and description of such parts is omitted.

In FIG. 14, an FPC pad 2707 is an electrode pad group that is used when an FPC (Flexible Print Circuit) is attached to the wireless chip 2601. An antenna bump 2708 is an electrode pad for attaching an antenna (not shown). When the antenna is attached, there is a possibility that the antenna bump 2708 is given excessive pressure. Therefore, it is desirable that components forming circuits such as a transistor be not provided under the antenna bump 2708.

It is effective to use the FPC pad 2707 mainly at failure analysis. Since the wireless chip obtains the power source voltage from the communication signal, if a problem occurs in the antenna or the power source circuit for example, the arithmetic circuit does not operate at all. Thus, failure analysis gets extremely difficult. However, the arithmetic circuit can be operated by supplying the power source voltage from the FPC to the wireless chip 2601 through the FPC pad 2707 and inputting any electric signal instead of an electric signal supplied from the antenna. Thus, failure analysis can be conducted effectively.

Moreover, it is more effective to provide the FPC pad 2707 at a position where measurement using a prober is possible. In other words, by providing the electrode pad in accordance with a pitch of a prober needle in the FPC pad 2707, measurement by a prober becomes possible. Using a prober can reduce man-hour for which the FPC is attached at failure analysis. In addition, since measurement can also be conducted in a state that a plurality of wireless chips are formed over a substrate, man-hour for dividing into each wireless chip can also be reduced. At mass production, it is possible to inspect the wireless chips just before the step of attaching the antennas. Thus, since defective items can be eliminated at an early stage of the steps, production cost can be reduced.

It is to be noted that the leak element described in Embodiment Modes 1 and 2 and Embodiments 1 to 3 can be incorporated in the power source circuit 2609 in this embodiment. Even if a communication signal with strong amplitude is supplied to the wireless chip in which the power source voltage is generated by a communication signal, such a structure makes it possible to retain the generated power source voltage within the specified voltage range. Thus, a highly-reliable wireless chip of which circuit will not be electrically destroyed by a strong radiowave attack is provided.

Embodiment 5

Figure 11:
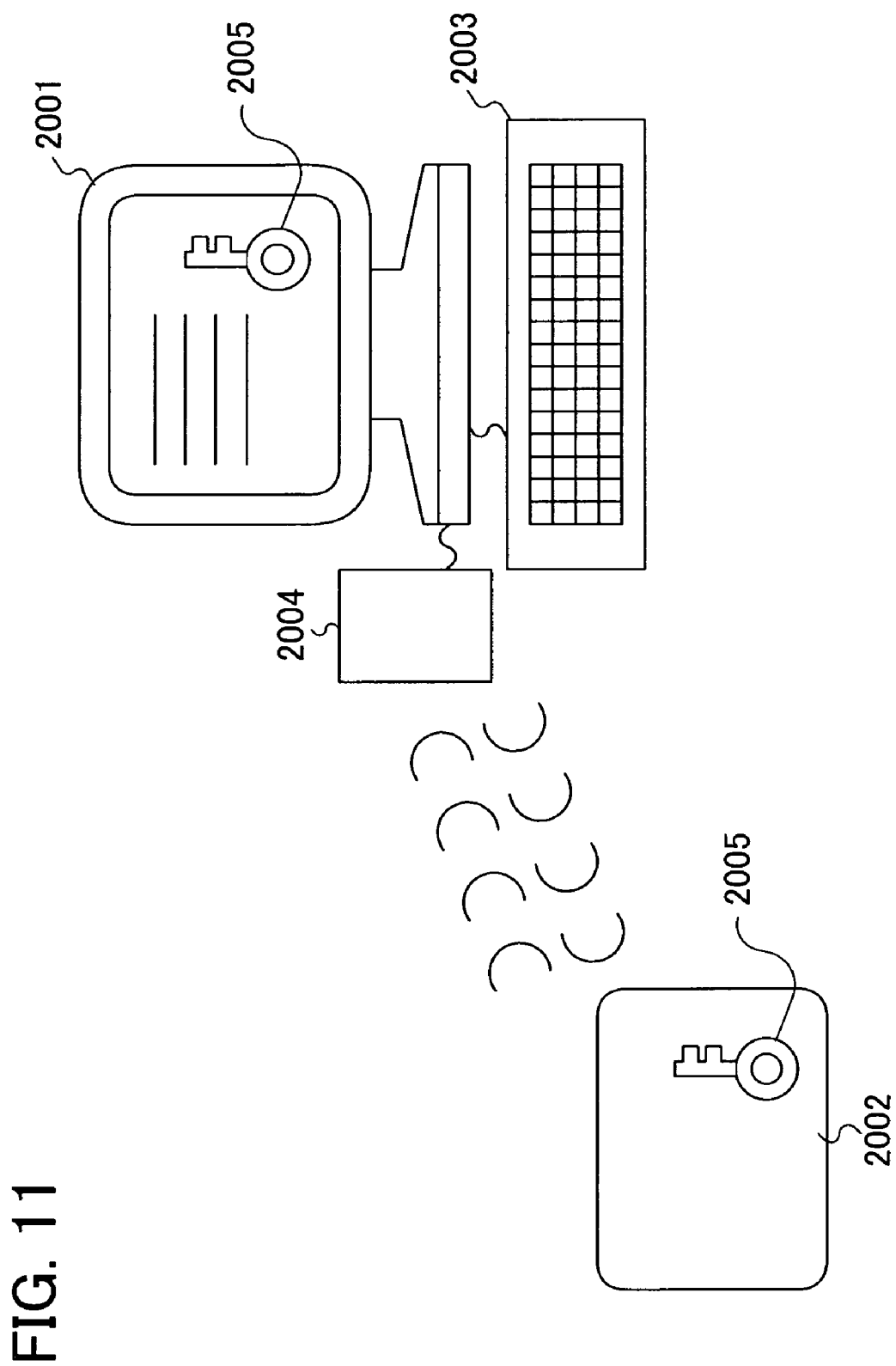
FIG. 11 schematically shows a user identification system using a semiconductor device of the present invention.
Figure 12:
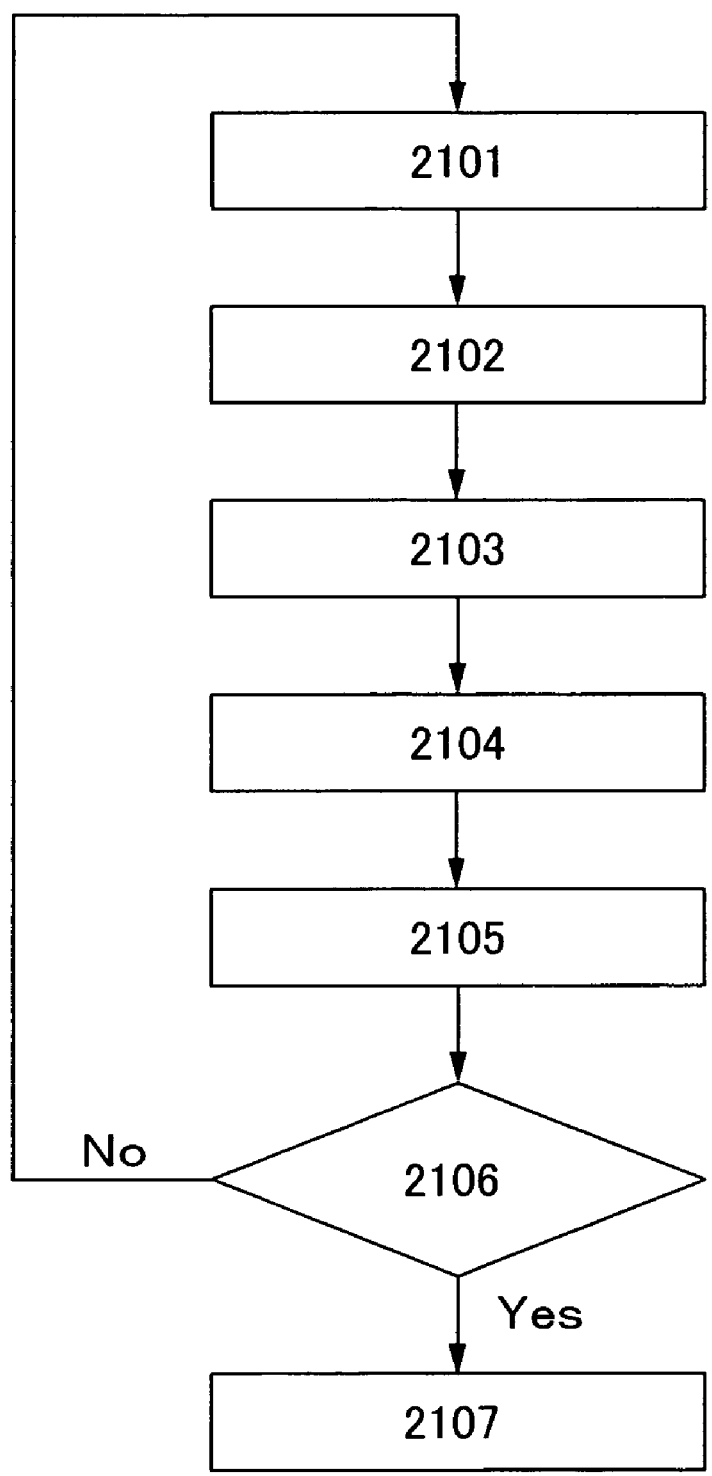
FIG. 12 is a flow chart of a user identification system using a semiconductor device of the present invention.

This embodiment will describe an example of a system using a semiconductor device of the present invention with reference to FIGS. 11 and 12. In this embodiment, description is made of a user identification system for a personal computer, which is superior in security by using a wireless chip as the semiconductor device of the present invention.

FIG. 11 is a schematic view of a user identification system in this embodiment, which shows a personal computer 2001 and a wireless chip 2002. The personal computer 2001 has an input device 2003 and a reader/writer 2004 connected thereto.

The personal computer 2001 and the wireless chip 2002 have common keys 2005 for cipher. In specific, data of the common keys 2005 are stored in memories of the personal computer 2001 and the wireless chip 2002. The common keys 2005 are, for example, 64-bit to 128-bit data and are used for encrypting plain text (data before being encrypted) and decrypting the cipher. As for the common keys, a different common key is formed for every user who is registered legitimately and the personal computer 2001 has all the common keys. In other words, the personal computer 2001 has the common keys as many as the legitimately registered users. On the other hand, a legitimately registered user owns the wireless chip 2002 and has only a common key unique to the user. The user should save the common key so that the others do not know it.

Although this embodiment shows an example of using a common key cipher method (see ISO/IEC 9798—2 Information technology—Security techniques—Entity authentication—Part 2: Mechanisms using symmetric encipherment algorithms) as a cipher method, another cipher method such as a public key cipher method can also be used (see ISO/IEC 9798—3 Information technology—Security techniques—Entity authentication—Part 3: Mechanisms using digital signature techniques).

The personal computer 2001 has a means for encrypting plain text using the common key 2005. In specific, the personal computer 2001 is to be provided with software for executing an encrypting algorithm. The wireless chip 2002 has a means for decrypting cipher text using the common key 2005. In specific, a decrypting algorithm is executed in the arithmetic circuit shown in the above embodiment modes.

A method for using the user identification system in this embodiment will be hereinafter described using a flow chart of FIG. 12.

First, a person who wants to use inputs a user name and a password in the personal computer 2001 using the input device 2003 (user name input 2101). The password is the one that a legitimate user registers in advance. The personal computer 2001 encrypts certain plain text using a corresponding common key based on the inputted user name (cipher data formation 2102). Here, the plain text may be either data having a particular meaning or meaningless data. Next, cipher data is sent from the reader/writer 2004 (cipher data transmission 2103). The wireless chip 2002 receives the cipher data and decrypts the cipher data using the common key 2005 (decrypting process 2104) and then sends the decrypted data to the reader/writer (decrypted-data transmission 2105). The personal computer 2001 compares the decrypted data with the original plain text (identification 2106), and identifies the user as a legitimately registered user only if the data are matched with each other, and then gives use permission to the person who wants to use (normal use 2107).

In the user identification system described in this embodiment, the user cannot use the computer if the user does not know a password and does not own the wireless chip. Thus, security is much tighter than identification using only password. Moreover, if the user carries the wireless chip, the user can use the personal computer in the same way as conventional identification using only passwords and the user does not feel additional burdens that much.

Although this embodiment has described user identification of the personal computer, this embodiment can be easily applied to another system that can be used only by legitimately registered users. For example, this embodiment can be easily applied to ATMs (Automated Teller Machines), CDs (Cash Dispensers), and so on.

Such a structure makes it possible to construct a user identification system at low cost with very tight security by using a semiconductor device of the present invention.

This embodiment can be freely combined with any of Embodiment Modes 1 and 2 and Embodiments 1 to 4.

This application is based on Japanese Patent Application serial no. 2005-298244 filed in Japan Patent Office on Oct. 12, 2005, the entire contents of which are hereby incorporated by reference.

What is claimed is:

1. A semiconductor device comprising:
a wireless chip comprising:
a power source circuit for generating a power source voltage by a radio signal,
the power source circuit comprising:
a diode; and
a leak element provided in the power source circuit,
wherein the diode is configured to rectify a voltage and output the rectified voltage to the leak element,
wherein the leak element is configured to retain the power source voltage within a specified voltage range by making a first electric resistance of the leak element lower than a second electric resistance of the leak element, and
wherein the first electric resistance is a resistance of the leak element at the time when a voltage which exceeds the specified voltage range generates in the power source circuit,
wherein the second electric resistance is a resistance of the leak element at the time when a voltage which is within the specified voltage range generates in the power source circuit, and
wherein the leak element is electrically connected to the diode.

2. The semiconductor device according to claim 1,
wherein the power source circuit is formed by a thin film transistor having a semiconductor thin film formed over a substrate having an insulating surface.

3. The semiconductor device according to claim 2,
wherein the substrate having an insulating surface is any one of a glass substrate, a quartz substrate, a plastic substrate, and an SOI substrate.

4. The semiconductor device according to claim 1,
wherein the leak element includes an N-type MOS transistor or a P-type MOS transistor.

5. The semiconductor device according to claim 1,
wherein the leak element includes an N-type memory transistor or a P-type memory transistor.

6. The semiconductor device according to claim 1,
wherein the leak element includes an MIS capacitor comprising a gate insulating film, and
wherein the gate insulating film has at least a first region and a second region having thinner film thickness than the first region.

7. The semiconductor device according to claim 1,
wherein the leak element includes an MIS capacitor comprising a semiconductor thin film, a gate electrode, and a gate insulating film therebetween, and
wherein the gate insulating film has at least a first region and a second region having thinner film thickness than the first region.

8. The semiconductor device according to claim 6,
wherein film thickness of the gate insulating film in the second region is in the range of 50 to 80% of the film thickness of the gate insulating film in the first region.

9. The semiconductor device according to claim 1,
wherein the leak element has an MIS capacitor comprising a semiconductor thin film, a gate electrode, and a gate insulating film therebetween,
wherein the gate insulating film has at least a first region and a second region having thinner film thickness than the first region, and
wherein the second region overlaps with an end portion of the gate electrode.

10. The semiconductor device according to claim 1,
wherein the leak element has an MIS capacitor comprising a semiconductor thin film, a gate electrode, and a gate insulating film therebetween,
wherein the gate insulating film has at least a first region and a second region having thinner film thickness than the first region,
wherein the first region overlaps with the semiconductor thin film, and
wherein the second region overlaps with an end portion of the semiconductor thin film.

11. A semiconductor device comprising:
a wireless chip comprising:
    a power source circuit for generating a power source voltage by a radio signal;
    the power source circuit comprising:
        a diode;
        a storage capacitor provided in the power source circuit; and
        a leak element provided in the power source circuit,
wherein the diode is configured to rectify a voltage and output the rectified voltage to the leak element,
wherein the leak element is configured to retain the power source voltage within a specified voltage range by flowing electric charges accumulated in the storage capacitor to the leak element as current by making a first electric resistance of the leak element lower than a second electric resistance of the leak element, and
wherein the first electric resistance is a resistance of the leak element at the time when a voltage which exceeds the specified voltage range generates in the power source circuit,
wherein the second electric resistance is a resistance of the leak element at the time when a voltage which is within the specified voltage range generates in the power source circuit, and
wherein the leak element is electrically connected to the diode.

12. The semiconductor device according to claim 11,
wherein the power source circuit is formed by a thin film transistor having a semiconductor thin film formed over a substrate having an insulating surface.

13. The semiconductor device according to claim 12,
wherein the substrate having an insulating surface is any one of a glass substrate, a quartz substrate, a plastic substrate, and an SOI substrate.

14. The semiconductor device according to claim 11,
wherein the power source voltage is a potential difference between a first output terminal and a second output terminal of the storage capacitor.

15. The semiconductor device according to claim 11,
wherein the leak element includes an N-type MOS transistor or a P-type MOS transistor.

16. The semiconductor device according to claim 11,
wherein the leak element includes an N-type memory transistor or a P-type memory transistor.

17. The semiconductor device according to claim 11,
wherein the leak element includes an MIS capacitor comprising a gate insulating film, and
wherein the gate insulating film has at least a first region and a second region having thinner film thickness than the first region.

18. The semiconductor device according to claim 11,
wherein the leak element includes an MIS capacitor comprising a semiconductor thin film, a gate electrode, and a gate insulating film therebetween, and
wherein the gate insulating film has at least a first region and a second region having thinner film thickness than the first region.

19. The semiconductor device according to claim 17,
wherein film thickness of the gate insulating film in the second region is in the range of 50 to 80% of the film thickness of the gate insulating film in the first region.

20. The semiconductor device according to claim 11,
wherein the leak element has an MIS capacitor comprising a semiconductor thin film, a gate electrode, and a gate insulating film therebetween,
wherein the gate insulating film has at least a first region and a second region having thinner film thickness than the first region, and
wherein the second region overlaps with an end portion of the gate electrode.

21. The semiconductor device according to claim 11,
wherein the leak element has an MIS capacitor comprising a semiconductor thin film, a gate electrode, and a gate insulating film therebetween,
wherein the gate insulating film has at least a first region and a second region having thinner film thickness than the first region,
wherein the first region overlaps with the semiconductor thin film, and
wherein the second region overlaps with an end portion of the semiconductor thin film.

22. A semiconductor device comprising:
a wireless chip comprising:
    a power source circuit for generating a power source voltage by a radio signal, comprising:
        an antenna portion including an antenna and a resonance capacitor;
        a rectifying portion including a diode; and
        a storage capacitor portion including a storage capacitor and a leak element,
wherein the diode is configured to rectify a voltage and output the rectified voltage to the leak element, wherein the leak element is configured to retain the power source voltage within a specified voltage range by flowing electric charges accumulated in the storage capacitor to the leak element as current by making a first electric resistance of the leak element lower than a second electric resistance of the leak element, and wherein the first electric resistance is a resistance of the leak element at the time when a voltage which exceeds the specified voltage range generates in the power source circuit, wherein the second electric resistance is a resistance of the leak element at the time when a voltage which is within the specified voltage range generates in the power source circuit, and wherein the leak element is electrically connected to the antenna through the diode.

23. The semiconductor device according to claim 22, wherein the power source circuit is formed by a thin film transistor having a semiconductor thin film formed over a substrate having an insulating surface.

24. The semiconductor device according to claim 23, wherein the substrate having an insulating surface is any one of a glass substrate, a quartz substrate, a plastic substrate, and an SOI substrate.

25. The semiconductor device according to claim 22, wherein the power source voltage is a potential difference between a first output terminal and a second output terminal of the storage capacitor portion.

26. The semiconductor device according to claim 22, wherein the leak element includes an N-type MOS transistor or a P-type MOS transistor.

27. The semiconductor device according to claim 22, wherein the leak element includes an N-type memory transistor or a P-type memory transistor.

28. The semiconductor device according to claim 22, wherein the leak element includes an MIS capacitor comprising a gate insulating film, and wherein the gate insulating film has at least a first region and a second region having thinner film thickness than the first region.

29. The semiconductor device according to claim 22, wherein the leak element includes an MIS capacitor comprising a semiconductor thin film, a gate electrode, and a gate insulating film therebetween, and wherein the gate insulating film has at least a first region and a second region having thinner film thickness than the first region.

30. The semiconductor device according to claim 28, wherein film thickness of the gate insulating film in the second region is in the range of 50 to 80% of the film thickness of the gate insulating film in the first region.

31. The semiconductor device according to claim 22, wherein the leak element has an MIS capacitor comprising a semiconductor thin film, a gate electrode, and a gate insulating film therebetween, wherein the gate insulating film has at least a first region and a second region having thinner film thickness than the first region, and wherein the second region overlaps with an end portion of the gate electrode.

32. The semiconductor device according to claim 22, wherein the leak element has an MIS capacitor comprising a semiconductor thin film, a gate electrode, and a gate insulating film therebetween, wherein the gate insulating film has at least a first region and a second region having thinner film thickness than the first region, wherein the first region overlaps with the semiconductor thin film, and wherein the second region overlaps with an end portion of the semiconductor thin film.

33. The semiconductor device according to claim 22, wherein the rectifying portion has a plurality of the diodes.

34. A semiconductor device comprising:
a wireless chip comprising:
an antenna;
a diode electrically connected to the antenna;
a storage capacitor electrically connected to the diode; and
a leak element electrically connected to the storage capacitor, wherein the diode is configured to rectify a voltage and output the rectified voltage to the leak element, wherein the leak element is configured to have a first electric resistance at the time when a voltage which exceeds a specified voltage range is applied thereto and a second electric resistance at the time when a voltage which is within the specified voltage range is applied thereto, wherein the first electric resistance is lower than the second electric resistance, and wherein the leak element is electrically connected to the antenna through the diode.

35. The semiconductor device according to claim 34, wherein the leak element is formed by a thin film transistor having a semiconductor thin film formed over a substrate having an insulating surface.

36. The semiconductor device according to claim 35, wherein the substrate having an insulating surface is any one of a glass substrate, a quartz substrate, a plastic substrate, and an SOI substrate.

37. The semiconductor device according to claim 34, wherein the leak element includes an N-type MOS transistor or a P-type MOS transistor.

38. The semiconductor device according to claim 34, wherein the leak element includes an N-type memory transistor or a P-type memory transistor.

39. The semiconductor device according to claim 34, wherein the leak element includes an MIS capacitor comprising a gate insulating film, and wherein the gate insulating film has at least a first region and a second region having thinner film thickness than the first region.

40. The semiconductor device according to claim 34, wherein the leak element includes an MIS capacitor comprising a semiconductor thin film, a gate electrode, and a gate insulating film therebetween, and wherein the gate insulating film has at least a first region and a second region having thinner film thickness than the first region.

41. The semiconductor device according to claim 39, wherein film thickness of the gate insulating film in the second region is in the range of 50 to 80% of the film thickness of the gate insulating film in the first region.

42. The semiconductor device according to claim 34, wherein the leak element has an MIS capacitor comprising a semiconductor thin film, a gate electrode, and a gate insulating film therebetween, wherein the gate insulating film has at least a first region and a second region having thinner film thickness than the first region, and wherein the second region overlaps with an end portion of the gate electrode.

43. The semiconductor device according to claim 34,
wherein the leak element has an MIS capacitor comprising a semiconductor thin film, a gate electrode, and a gate insulating film therebetween,
wherein the gate insulating film has at least a first region and a second region having thinner film thickness than the first region,
wherein the first region overlaps with the semiconductor thin film, and
wherein the second region overlaps with an end portion of the semiconductor thin film.

44. A semiconductor device comprising:
a wireless chip comprising:
a circuit for supplying a power source voltage for the wireless chip, comprising:
  an antenna;
  a storage capacitor electrically connected to the antenna;
  a diode; and
  a leak element electrically connected to the storage capacitor,
a clock generating circuit;
a demodulating circuit; and
a modulating circuit,
wherein the circuit for supplying power source voltage supplies a voltage to each circuit,
wherein the diode is configured to rectify a voltage and output the rectified voltage to the leak element,
wherein the leak element is configured to have a first electric resistance at the time when a voltage which exceeds a specified voltage range generates in the wireless chip and a second electric resistance at the time when a voltage which is within the specified voltage range generates in the wireless chip,
wherein the first electric resistance is lower than the second electric resistance, and
wherein the leak element is electrically connected to the antenna through the diode.

45. The semiconductor device according to claim 44,
wherein the wireless chip is formed by a thin film transistor having a semiconductor thin film formed over a substrate having an insulating surface.

46. The semiconductor device according to claim 45,
wherein the substrate having an insulating surface is any one of a glass substrate, a quartz substrate, a plastic substrate, and an SOI substrate.

47. The semiconductor device according to claim 44,
wherein the power source voltage is a potential difference between a first output terminal and a second output terminal of the storage capacitor.

48. The semiconductor device according to claim 44,
wherein the leak element includes an N-type MOS transistor or a P-type MOS transistor.

49. The semiconductor device according to claim 44,
wherein the leak element includes an N-type memory transistor or a P-type memory transistor.

50. The semiconductor device according to claim 44,
wherein the leak element includes an MIS capacitor comprising a gate insulating film, and
wherein the gate insulating film has at least a first region and a second region having thinner film thickness than the first region.

51. The semiconductor device according to claim 44,
wherein the leak element includes an MIS capacitor comprising a semiconductor thin film, a gate electrode, and a gate insulating film therebetween, and
wherein the gate insulating film has at least a first region and a second region having thinner film thickness than the first region.

52. The semiconductor device according to claim 50,
wherein film thickness of the gate insulating film in the second region is in the range of 50 to 80% of the film thickness of the gate insulating film in the first region.

53. The semiconductor device according to claim 44,
wherein the leak element has an MIS capacitor comprising a semiconductor thin film, a gate electrode, and a gate insulating film therebetween,
wherein the gate insulating film has at least a first region and a second region having thinner film thickness than the first region, and
wherein the second region overlaps with an end portion of the gate electrode.

54. The semiconductor device according to claim 44,
wherein the leak element has an MIS capacitor comprising a semiconductor thin film, a gate electrode, and a gate insulating film therebetween,
wherein the gate insulating film has at least a first region and a second region having thinner film thickness than the first region,
wherein the first region overlaps with the semiconductor thin film, and
wherein the second region overlaps with an end portion of the semiconductor thin film.

55. A semiconductor device comprising:
a wireless chip comprising:
a controller;
a CPU;
a ROM;
a RAM;
a circuit for supplying a power source voltage for the wireless chip, comprising:
  an antenna;
  a storage capacitor electrically connected to the antenna;
  a diode; and
  a leak element electrically connected to the storage capacitor,
a clock generating circuit;
a demodulating circuit; and
a modulating circuit,
wherein the CPU, the ROM, the RAM, the demodulating circuit, and the modulating circuit are operationally connected to the controller,
wherein the diode is configured to rectify a voltage and output the rectified voltage to the leak element,
wherein the leak element is configured to have a first electric resistance at the time when a voltage which exceeds a specified voltage range generates in the wireless chip and a second electric resistance at the time when a voltage which is within the specified voltage range generates in the wireless chip,
wherein the first electric resistance is lower than the second electric resistance, and
wherein the leak element is electrically connected to the antenna through the diode.

56. The semiconductor device according to claim 55,
wherein the wireless chip is formed by a thin film transistor having semiconductor thin film formed over a substrate having an insulating surface.

57. The semiconductor device according to claim 56,
wherein the substrate having an insulating surface is any one of a glass substrate, a quartz substrate, a plastic substrate, and an SOI substrate.

58. The semiconductor device according to claim 55,
wherein the power source voltage is a potential difference between a first output terminal and a second output terminal of the storage capacitor.

59. The semiconductor device according to claim 55,
wherein the leak element includes an N-type MOS transistor or a P-type MOS transistor.

60. The semiconductor device according to claim 55,
wherein the leak element includes an N-type memory transistor or a P-type memory transistor.

61. The semiconductor device according to claim 55,
wherein the leak element includes an MIS capacitor comprising a gate insulating film, and
wherein the gate insulating film has at least a first region and a second region having thinner film thickness than the first region.

62. The semiconductor device according to claim 55,
wherein the leak element includes an MIS capacitor comprising a semiconductor thin film, a gate electrode, and a gate insulating film therebetween, and
wherein the gate insulating film has at least a first region and a second region having thinner film thickness than the first region.

63. The semiconductor device according to claim 61,
wherein film thickness of the gate insulating film in the second region is in the range of 50 to 80% of the film thickness of the gate insulating film in the first region.

64. The semiconductor device according to claim 55,
wherein the leak element has an MIS capacitor comprising a semiconductor thin film, a gate electrode, and a gate insulating film therebetween,
wherein the gate insulating film has at least a first region and a second region having thinner film thickness than the first region, and
wherein the second region overlaps with an end portion of the gate electrode.

65. The semiconductor device according to claim 55,
wherein the leak element has an MIS capacitor comprising a semiconductor thin film, a gate electrode, and a gate insulating film therebetween,
wherein the gate insulating film has at least a first region and a second region having thinner film thickness than the first region,
wherein the first region overlaps with the semiconductor thin film, and
wherein the second region overlaps with an end portion of the semiconductor thin film.

* * * * *